US008835865B2

(12) United States Patent
Zaitseva et al.

(10) Patent No.: US 8,835,865 B2
(45) Date of Patent: Sep. 16, 2014

(54) MIXED CRYSTAL ORGANIC SCINTILLATORS

(71) Applicant: Lawrence Livermore National Security, LLC, Livermore, CA (US)

(72) Inventors: Natalia P. Zaitseva, Livermore, CA (US); M Leslie Carman, San Ramon, CA (US); Andrew M. Glenn, Livermore, CA (US); Sebastien Hamel, Livermore, CA (US); Robert Hatarik, Discovery Bay, CA (US); Stephen A. Payne, Castro Valley, CA (US); Wolfgang Stoeffl, Livermore, CA (US)

(73) Assignee: Lawrence Livermore National Security, LLC., Livermore, CA (US)

( * ) Notice: Subject to any disclaimer, the term of this patent is extended or adjusted under 35 U.S.C. 154(b) by 136 days.

(21) Appl. No.: 13/670,778

(22) Filed: Nov. 7, 2012

(65) Prior Publication Data

US 2014/0124677 A1    May 8, 2014

(51) Int. Cl.
*G01T 3/06* (2006.01)
*C30B 7/08* (2006.01)
*C30B 29/54* (2006.01)
*C30B 7/06* (2006.01)

(52) U.S. Cl.
CPC ... *G01T 3/06* (2013.01); *C30B 7/08* (2013.01); *C30B 29/54* (2013.01); *C30B 7/06* (2013.01)
USPC .................................................. 250/390.11

(58) Field of Classification Search
CPC .......................................................... G01T 3/06
USPC .................................................... 250/390.11
See application file for complete search history.

(56) References Cited

PUBLICATIONS

Phillips et al., "Measurements of Scintillation Lifetimes," The Review of Scientific Instruments, vol. 24, No. 8, Aug. 1953, pp. 611-616.
Wright, G. T., "Scintillation Decay Times of Organic Crystals," Proceedings of the Physical Society, Section B, vol. 69, No. 3, pp. 358-372.
Owen, R. B., "The Decay Times of Organic Scintillators and Their Application to the Discrimination Between Particles of Differing Specific Ionization," IRE Transactions on Nuclear Science, Dec. 1958, pp. 198-201.
Zaitseva et al., "Pulse Shape Discrimination in Impure and Mixed Single-Crystal Organic Scintillators," 2011 IEEE, IEEE Transactions on Nuclear Science, vol. 58, No. 6, Dec. 2011, pp. 3411-3420.
Zaitseva et al., "Neutron detection with single crystal organic scintillators," 2009 SPIE, Proceedings of SPIE, vol. 7449, pp. 744911/1-744911/10.

*Primary Examiner* — David Porta
*Assistant Examiner* — Hugh H Maupin
(74) *Attorney, Agent, or Firm* — Dominic M. Kotab

(57) ABSTRACT

A mixed organic crystal according to one embodiment includes a single mixed crystal having two compounds with different bandgap energies, the organic crystal having a physical property of exhibiting a signal response signature for neutrons from a radioactive source, wherein the signal response signature does not include a significantly-delayed luminescence characteristic of neutrons interacting with the organic crystal relative to a luminescence characteristic of gamma rays interacting with the organic crystal. According to one embodiment, an organic crystal includes bibenzyl and stilbene or a stilbene derivative, the organic crystal having a physical property of exhibiting a signal response signature for neutrons from a radioactive source.

42 Claims, 17 Drawing Sheets

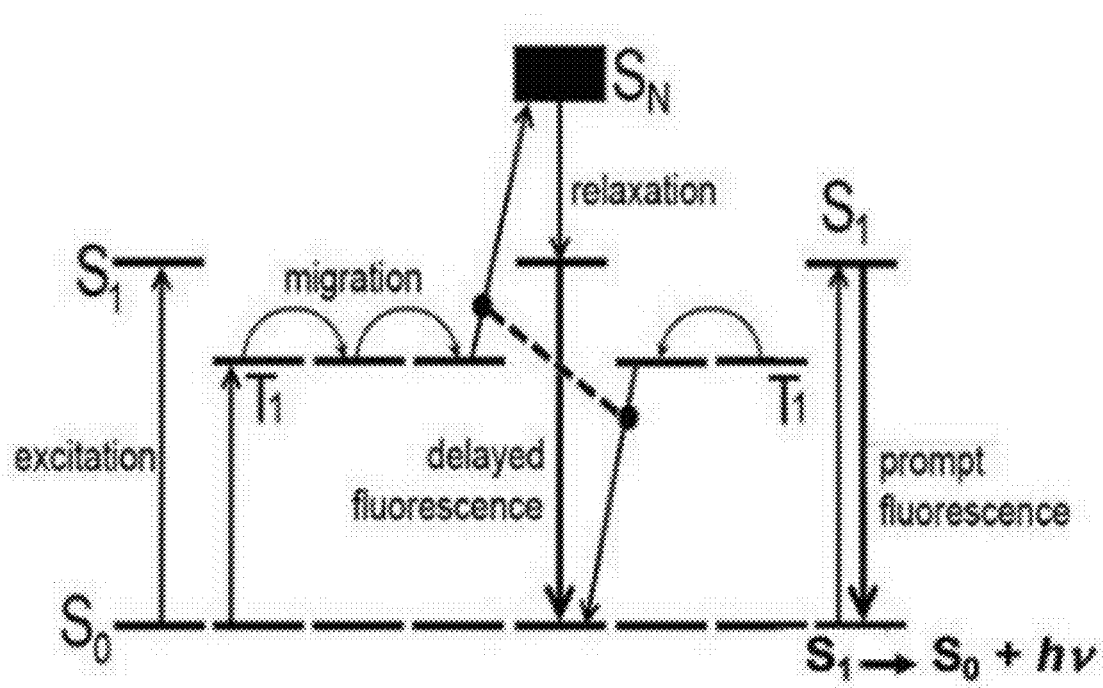
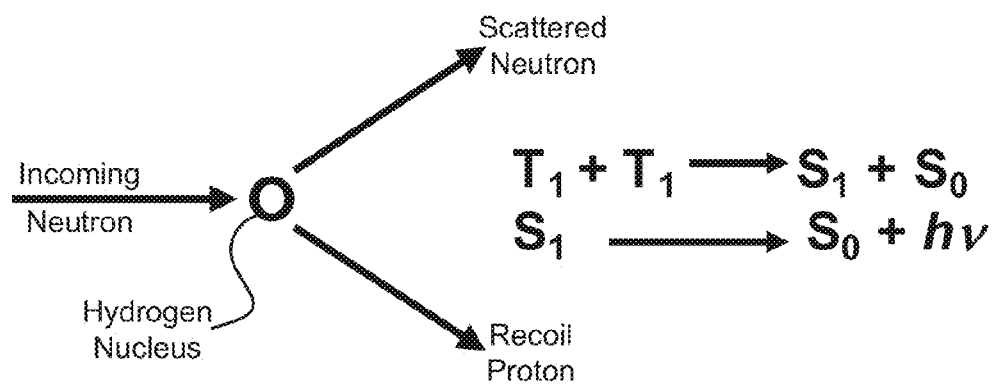
FIG. 1
(prior art)

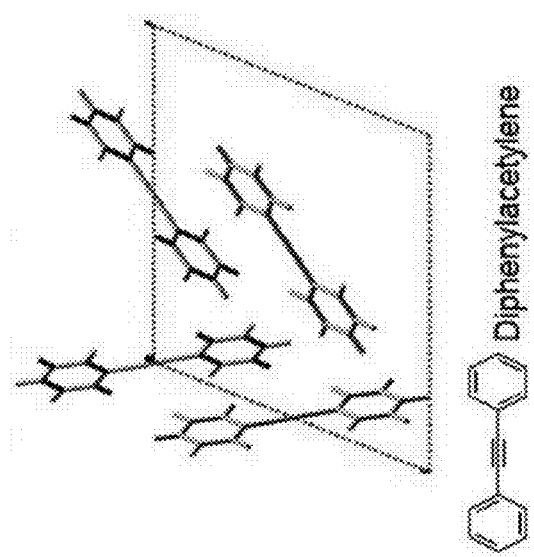
FIG. 4A Diphenylacetylene
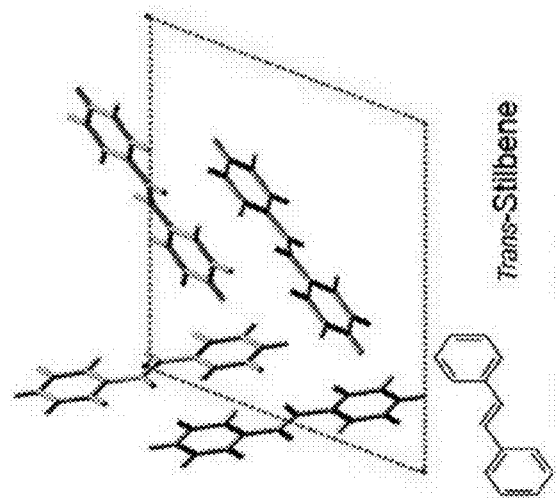
FIG. 4B Trans-Stilbene
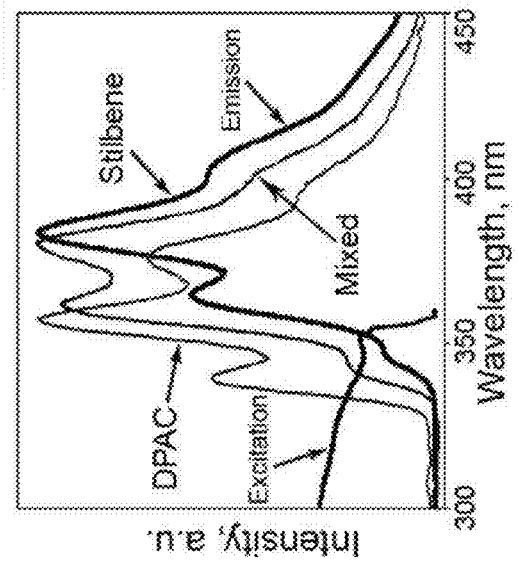
FIG. 4C

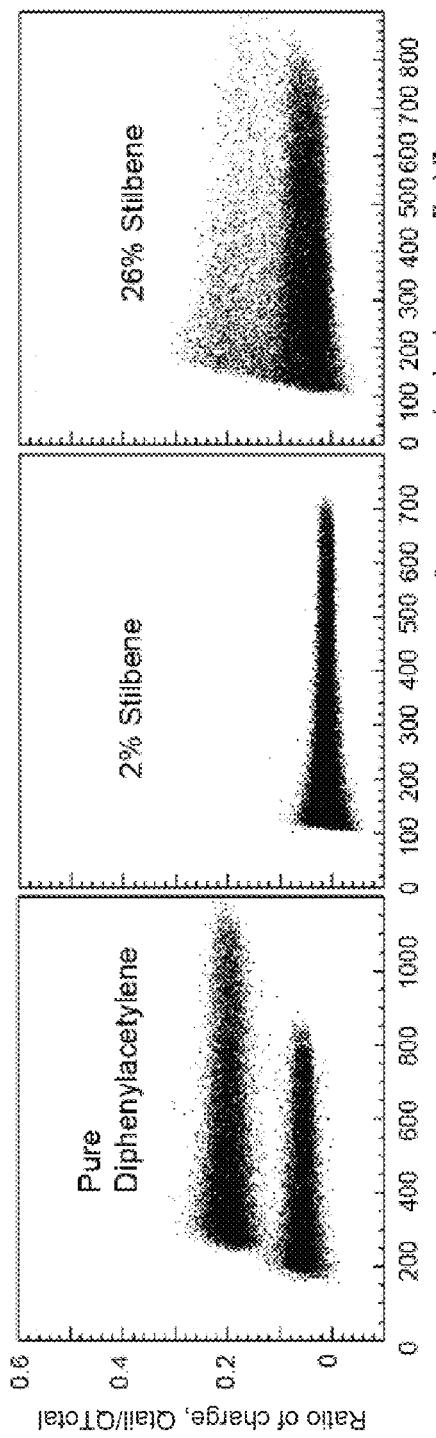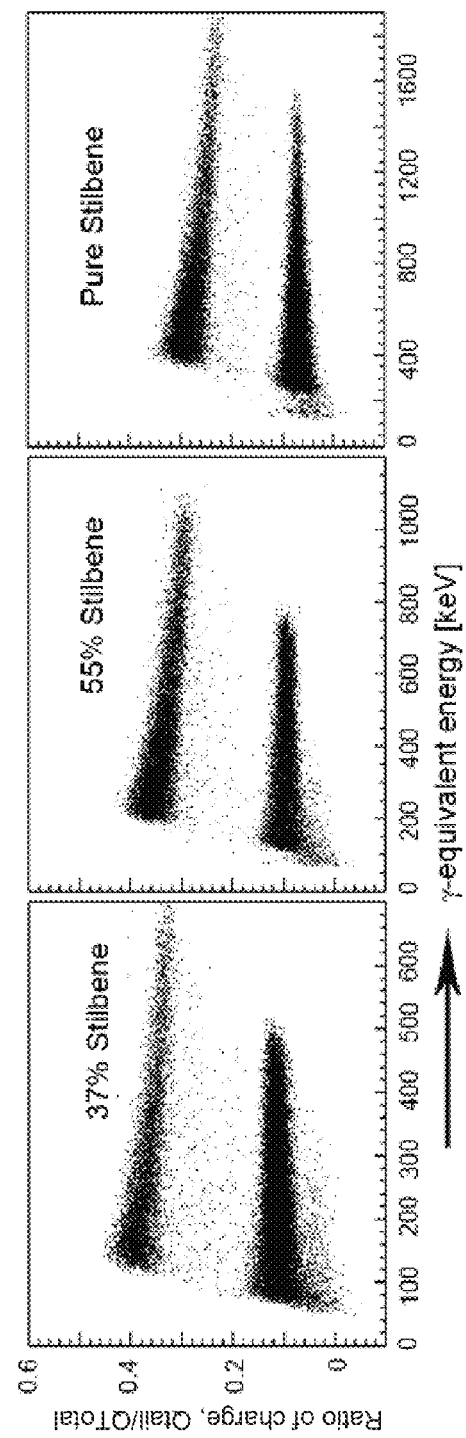

MIXED CRYSTAL ORGANIC SCINTILLATORS

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to radiation detection, and more particularly to mixed crystals for neutron radiation detectors and related methods.

BACKGROUND

Pulse shape discrimination (PSD) provides means for high-energy neutron detection in the presence of gamma radiation background by utilizing the difference in the shapes of scintillation pulses excited by neutrons (recoil protons) and gamma (γ)-rays in organic scintillators. PSD phenomena are based on the existence of two-decay component fluorescence, in which, in addition to the main component decaying exponentially (prompt fluorescence), there is usually a slower emission that has the same wavelength, but longer decay time (delayed emission). According to a commonly accepted mechanism shown in FIG. 1, the fast component results from the direct radiative de-excitation of excited singlet states ($S_1$), while the slow component originates from the collisional interaction of pairs of molecules (or excitons) in the lowest excited n-triplet states ($T_1$).

Since the triplet is known to be mobile in some compounds, the energy migrates until two triplets collide and experience a process, shown as Equation 1:

$$T_1 + T_1 \rightarrow S_0 + S_1 \qquad \text{Equation 1}$$

In Equation 1, $T_1$ is a triplet, $S_0$ is the ground state, and $S_1$ is a first excited state. Finally, the delayed singlet emission occurs with a decay rate characteristic of the migration rate and concentration of the triplet population, which is represented as Equation 2:

$$S_1 \rightarrow S_0 + h\nu \qquad \text{Equation 2}$$

In Equation 2, hv is fluorescence, while $S_0$ is the ground state and $S_1$ is a first excited state. The lifetime of the delayed emission is determined by the lifetime of $T_1$ and the rate of $T_1 T_1$ collisions. The short range of the energetic protons produced from neutron collisions yields a high concentration of triplets, compared to the longer range of the electrons from the gamma interactions, leading to the enhanced level of delayed emission with longer decay times in neutron-induced pulses in comparison to those produced by the gamma excitation.

The observation of PSD is believed to be, in part, related to the benzene ring structure, allowing for the migration of triplet energy. However, its relevance to other specific properties of organic materials, such as physical state, molecular and crystallographic structure, or presence of impurities is unknown.

It would be beneficial to obtain organic scintillator crystals, including those having stilbene, which exhibit good PSD and/or are useful for other applications.

It would also be beneficial to obtain organic scintillator crystals, including those having stilbene, and which do not exhibit PSD, but are useful nonetheless for neutron detection.

SUMMARY

According to one embodiment, an organic crystal includes bibenzyl and stilbene or a stilbene derivative, the organic crystal having a physical property of exhibiting a signal response signature for neutrons from a radioactive source.

According to another embodiment, a mixed organic crystal includes a single mixed crystal having two compounds with different bandgap energies, the organic crystal having a physical property of exhibiting a signal response signature for neutrons from a radioactive source, wherein the signal response signature does not include a significantly-delayed luminescence characteristic of neutrons interacting with the organic crystal relative to a luminescence characteristic of gamma rays interacting with the organic crystal.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 1 shows a mechanism for delayed photoluminescence according to the prior art.

FIGS. 4A and 4B show a representation of the molecular crystal structure of diphenylacetylene and stilbene, respectively, according to the prior art.

FIG. 4C shows a plot of the photoluminescence spectra of pure and mixed stilbene crystals according to one embodiment.

FIG. 5A shows a PSD plot of the ratio of charge from delayed emission versus energy for pure a diphenylacetylene crystal according to one embodiment.

FIGS. 5B through 5E show PSD plots of the ratio of charge from delayed emission versus energy for mixed diphenylacetylene-stilbene crystals according to various embodiments.

FIG. 5F shows a PSD plot of the ratio of charge from delayed emission versus energy for a pure stilbene crystal according to one embodiment.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description describes several illustrative embodiments for mixed organic scintillator crystals and the resultant products, as well as systems incorporating such crystals.

In one general embodiment, an organic crystal includes bibenzyl and stilbene or a stilbene derivative, the organic crystal having a physical property of exhibiting a signal response signature for neutrons from a radioactive source.

In another general embodiment, a mixed organic crystal includes a single mixed crystal having two compounds with different bandgap energies, the organic crystal having a physical property of exhibiting a signal response signature for neutrons from a radioactive source, wherein the signal response signature does not include a significantly-delayed luminescence characteristic of neutrons interacting with the organic crystal relative to a luminescence characteristic of gamma rays interacting with the organic crystal.

PSD of organic scintillators involves subtle physical phenomena that give rise to the delayed luminescence characteristic of heavier particles such as fast neutrons (imparting energy to protons) and alphas, leading to the emergence of a long decay component as a signature of the interaction. Gamma rays transfer their energy to electrons, which are much lighter and therefore have a greater stopping length and give rise to a far lower energy density in a material and a reduced long decay component.

Figure 2A:
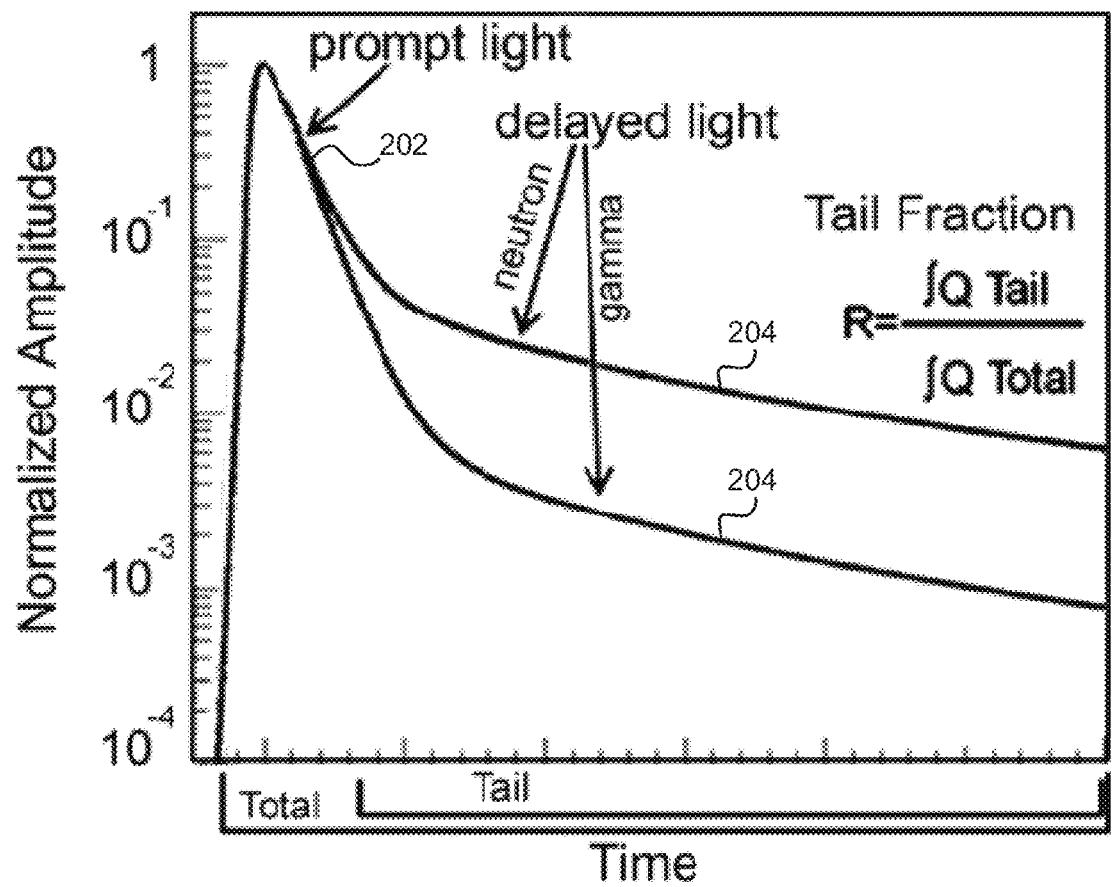
FIG. 2A shows a plot of average waveforms for stilbene indicating different levels of delayed light in neutron and gamma scintillation pulses according to one embodiment.

From measurements taken during the course of experiments, the differences in decay shapes are apparent. In FIG. 2A, a plot of average waveforms for stilbene indicating different levels of delayed light in neutron and gamma scintillation pulses is shown according to one embodiment. As can be seen from the plot, some light is produced by the crystal almost immediately, referred to as prompt light, and other light is produced by the crystal over a period of time, referred to as delayed light. Generally, the plot for each type of radiation will have a steep component 202 and a tail component 204. The upper line in the plot represents neutron light decay, while the lower line represents gamma (γ) light decay. As shown in FIG. 2A, the shape for the neutron response has a large tail component 204, which is much smaller or almost negligible for gammas. Thus, stilbene is able to differentiate between the neutron and gamma light decays, and produces noticeably different lines for each radiation type. However, not every compound has this ability to separate between gamma and neutron light decay; therefore compounds with such ability are very useful for PSD.

Figure 2B:
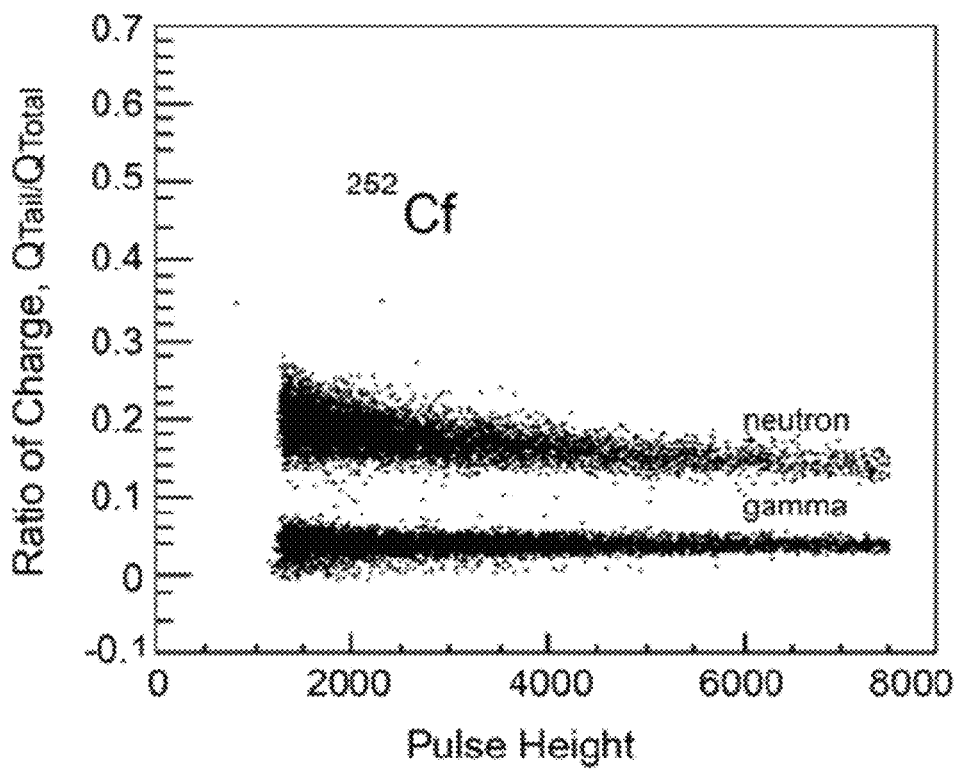
FIG. 2B shows a PSD pattern of a stilbene crystal obtained by digitized separation of neutron and gamma pulses according to one embodiment.

Modern high-speed waveform digitizers allow for easy separation of neutron and gamma pulses, enabling rapid characterization of PSD properties, as shown in FIG. 2B. The waveforms may be numerically integrated over two time intervals: $\Delta_{Total}$ and a subinterval $\Delta_{Tail}$ (e.g., for >50 nsec), corresponding to the total charge and the delayed component of the signal, respectively. The value of the ratio of charge $R=Q_{Tail}/Q_{Total}$ for the two time intervals indicates whether the considered event was likely produced by a neutron (high R value) or a gamma ray (small R value). The plot shown in FIG. 2B reveals the presence of both neutrons (upper scatter points) and gammas (lower scatter points) in a plot of the ratio of change ($Q_{Tail}/Q_{Total}$) versus the pulse height.

Figure 2C:
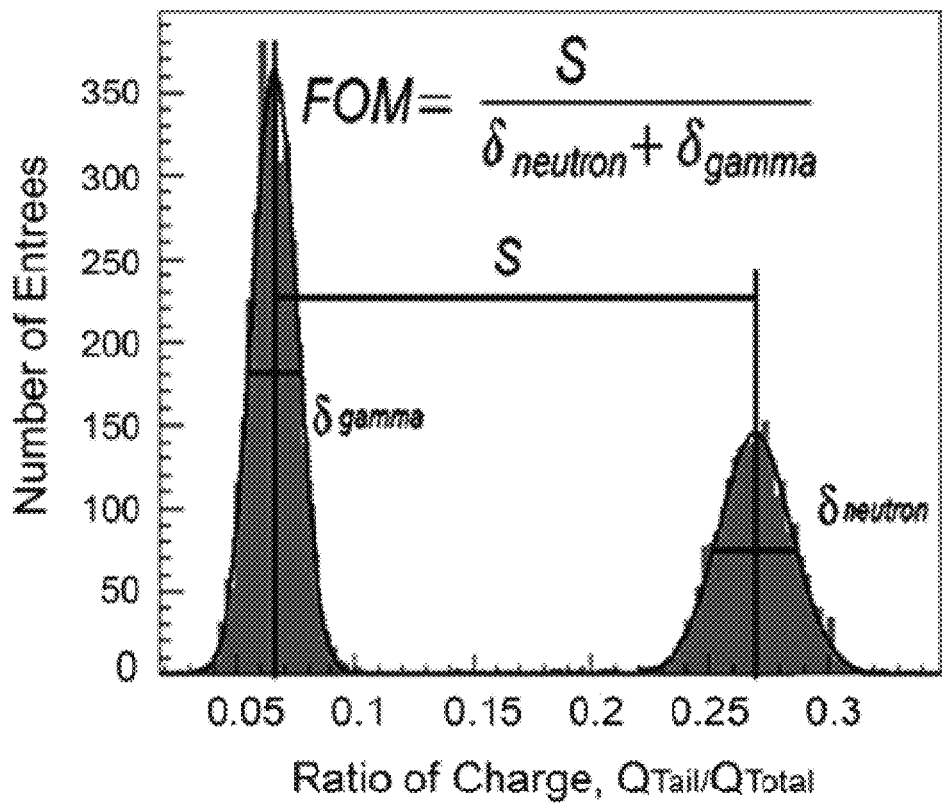
FIG. 2C shows PSD profiles of stilbene used for calculation of the PSD figure of merit (FOM) according to one embodiment.

FIG. 2C illustrates one approach where the neutron/gamma delayed light separation, S, in stilbene is used for calculation of the PSD figure of merit (FOM). The larger the separation, S, the better the organic crystal is at PSD for distinguishing gammas and neutrons.

Figure 3:
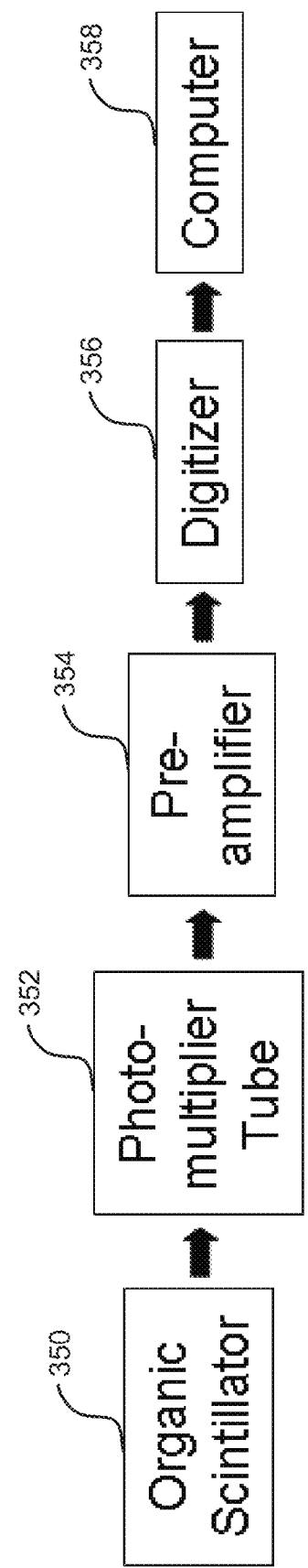
FIG. 3 shows a simplified layout of an instrument according to one embodiment.

A simplified schematic layout of an instrument is shown in FIG. 3 according to one embodiment, where light from the organic scintillator 350 may be sensed by a photodetector, such as a photomultiplier tube 352, then amplified e.g., by a preamplifer 354, digitized e.g., by an analog to digital converter 356, and numerically processed by a computer 358 to calculate the PSD. This methodology can be applied to data collected for any organic crystal to obtain plots that can be interpreted to determine PSD properties. This type of signal analysis can also be accomplished with analog electronics.

Organic crystals exhibiting PSD properties may be obtained by different methods, such as melt or solution growth techniques. For example, in some embodiments, low-temperature solution growth may allow for faster and less expensive production of a wide range of small-scale organic single crystals. With respect to the potential for growth to large sizes, crystals grown by solution methods, in some approaches, may have an advantage in producing crystals with much lower stress than is typical for highly anisotropic crystals grown by Bridgman techniques. However, production of such crystals by solution growth has been elusive.

The present description provides several embodiments describing solution growth methodology and products thereof that have varying PSD properties. Some of the most sought after characteristics for candidate solution-grown organic crystals include:

1) High hydrogen content for interactions with neutrons.
2) Components including low-Z constituents, such as H, C, N, F, and O, to avoid excessive gamma interaction.

3) Inclusion of phenyl rings that fluoresce efficiently from the singlet state and also exhibit delayed emission for PSD.
4) Crystals that can be grown from common solvents (such as water, alcohol, toluene, etc.) for low-cost production.
5) Materials that have acceptable fragility and hygroscopicity (e.g., low sensitivity to moisture).

Several new materials with PSD properties approaching that of stilbene have been identified. Among these discovered materials, the most promising scintillators include 1-1-4-4-tetraphenyl-1-3-butadiene, 2-fluorobiphenyl-4-carboxylic acid, 9-10-diphenylanthracene, and 1-3-5-triphenylbenzene, which, in addition, have been found to be easily grown from solution. Furthermore, several new mixed crystals with PSD properties have been identified, including, but not limited to, diphenylacetylene and stilbene or a stilbene derivative, bibenzyl and stilbene and a stilbene derivative.

U.S. patent application Ser. No. 12/418,434 to Zaitseva et al., filed Apr. 3, 2009, which is herein incorporated by reference, describes several methods for solution growth of crystals, and resulting products. Implementation of bibenzyl into such crystals was not contemplated; nor would a result of such modification have been predictable at the time of filing U.S. patent application Ser. No. 12/418,434. However, it has surprisingly been found that bibenzyl may be used to create an organic crystal comprising bibenzyl and stilbene or a stilbene derivative, the organic crystal having a physical property of exhibiting a signal response signature for neutrons from a radioactive source. Moreover, it has surprisingly been found that bibenzyl behaves very similarly to DPAC, and so one skilled in the art, now being apprised of the teachings herein, may implement similar teachings as those presented in U.S. patent application Ser. No. 12/418,434 to create an organic crystal comprising bibenzyl and stilbene or a stilbene derivative.

Various embodiments of experimental and computational methods corresponding to PSD in pure, impure and mixed organic crystal scintillators are described herein. For example, in some approaches, raw material of trans-stilbene (96%-99%), diphenylacetylene (DPAC, 98%) and other solid powders used for crystal growth were purchased from different vendors (Aldrich, Alfa Aesar, Acros Organics and TCI America). Prior to growth, all compounds were partially purified by recrystallization from toluene (Aldrich, 99.8%) solutions. A simple evaporation technique was used to grow small single crystals (1-2 cm in size) for the initial tests. Mixed crystals were grown from solutions containing DPAC and stilbene in different ratios. The chemical composition of the growth solutions and crystals was measured by gas chromatography-mass spectrometry (GC-MS) using a Hewlett Packard (HP) 6890 GC coupled to a HP5973 mass selective detector with the injection temperature set at 250° C. Chromatographic separation was achieved using a DB-5MS column (30 m 0.25 mm id, 0.25-μm film thickness), with the GC oven ramped from 40° C. to 250° C. over 35.5 min. The mass selective detection was run in full-scan mode (30 to 550 m/z). DPAC and stilbene were identified by MS=178 and 180, respectively, and authenticated with a NIST library search. They were quantified using pure stilbene and DPAC standards.

Photoluminescence (PL) spectra were measured using a commercial Fluoromax-2 spectrometer. The scintillation efficiency of crystals was evaluated from gamma light yield (LY) obtained from the position of the Compton edge in the $^{137}$Cs spectra relative to the Compton edge of a pure stilbene crystal. As used herein, 500 keV gamma equivalent is defined by 50% of the Compton edge peak.

In some approaches, neutron detection properties of grown crystals were studied using the pulse shape discrimination (PSD) technique, which allows for the separation of the scintillation pulses produced by neutron and gamma events via the relative increase in delayed light for neutron stimulations. The measurements were performed using a $^{252}$Cf source shielded with 5.1 cm of lead, which reduced the gamma rates to the same order of magnitude as neutrons, to irradiate crystals coupled to an R6231-S Hamamatsu photomultiplier tube (PMT). The signals collected at the PMT anode were recorded using a high-resolution waveform CompuScope 14200 digitizer with a sampling rate of 200 MS/s, for offline analysis. The ability of crystals to discriminate between the neutrons and gamma rays emitted from the $^{252}$Cf source was evaluated using the $Q_{Tail}/Q_{Total}$ PSD discriminator, as shown in FIG. 2A. The waveforms were numerically integrated over two time intervals: $\Delta_{Total}$ and a subinterval $\Delta_{Tail}$, corresponding to the total charge and the delayed component of the signal, respectively. The value of the ratio of charge $R=Q_{Tail}/Q_{Total}$ for the two time intervals indicate whether the considered event was likely produced by a neutron (high R value) or a gamma ray (small R value). Comparative PSD tests made with solution and melt-grown stilbene did not reveal any substantial influence of growth methods, if crystals of the same size and purity were used for the measurements.

Also in some approaches, density functional theory (DFT) calculations were used to obtain the relaxed geometry in the first triplet excited state ($T_1$) and in the ground state ($S_0$) of both stilbene and DPAC. The triplet excitation energy was taken as the total energy difference between the triplet and the ground states at their respective optimized geometries. The calculations were performed with the Vienna ab initio simulation package using projector augmented wave pseudopotentials to represent the ion-electron interactions.

Various results of the aforementioned approaches are discussed herein. Stilbene and diphenylacetylene are very similar molecules, differing only by the double and triple bonds between the central carbon atoms, as shown in FIGS. 4A and 4B. The similarity between the structures of diphenylacetylene (DPAC) and stilbene molecules may explain the nearly identical crystallographic structures of both compounds. For example, the lattice parameters for DPAC are: a=15.488 Å, b=5.754 Å, c=12.766 Å, α=90°, β=113.36°, γ=90°; whereas the lattice parameters for stilbene are: a=15.478 Å, b=5.66 Å, c=12.287 Å, α=90°, β=112.03°, γ=90°. The relatively small difference in the lattice parameters suggests that the compounds can form solid solutions and mixed crystals. A proof of this expectation was provided by the frequent growth of good quality, faceted crystals in some approaches. The chemical analysis of said crystals showed mixed composition with different concentrations of DPAC and stilbene.

Stilbene and DPAC also exhibit very similar photoluminescence spectra, with stilbene emission slightly shifted to the region of longer wavelengths, as shown in FIG. 4C. These similarities, however, are not reflected either in PSD properties or in the scintillation efficiency. Similarly, there is an absence in the literature of a proper understanding of the connection between PSD and the specific nature of organic compounds.

Measurements made with numerous stilbene crystals grown according to various approaches and experiments discussed above, always revealed excellent PSD similar to that shown in FIG. 2B. However, the situation was different in some embodiments for DPAC crystals, which, depending on the origin and batch of the initial material, might have large variations of PSD from a good level to its complete absence. Combined chemical and PSD analysis performed on the crystals showed that the variation of the properties related to the presence or absence of impurities in numerous approaches. A surprising and unexpected result obtained in analysis of DPAC crystals without PSD was that all of them contained stilbene in the amount of 1%-2%. On the contrary, a good level of PSD was typical only for DPAC crystals in approaches where no traces of stilbene were detected, as shown in FIG. 5A.

In more embodiments, about 50 DPAC crystals were intentionally doped with controlled stilbene additions. These embodiments confirmed the sharp quenching effect of the stilbene impurity on the PSD of DPAC in the range of stilbene concentrations of about 0.1-10%. FIG. 5B shows that, in some approaches, as a result of the PSD loss, the neutron and gamma peaks, which are clearly separated in pure materials, may become joined in one narrow pattern corresponding to a sharply decreased fraction of the delayed light. Scintillators without clear PSD respond to both gammas and neutrons by increasing shielding and moderator without changing the distance to the $^{252}$Cf source. For example, in some approaches, adding 5.1 cm of high-density polyethylene may reduce the count rate to 67% of nominal; the addition of 5.1 cm of Pb, for a total of 10.2 cm, may reduce the count rate to 70% of nominal. In further approaches, the mixed crystals grown at higher stilbene concentrations may show reappearance of the delayed light resulting first in a broadening of the single pattern (as shown in FIG. 5C) followed by its rapid return to neutron/gamma separation (as shown in FIG. 5D) and PSD similar or even exceeding that typical for the corresponding stilbene crystals (as shown in FIGS. 5E-F).

Figure 6A:
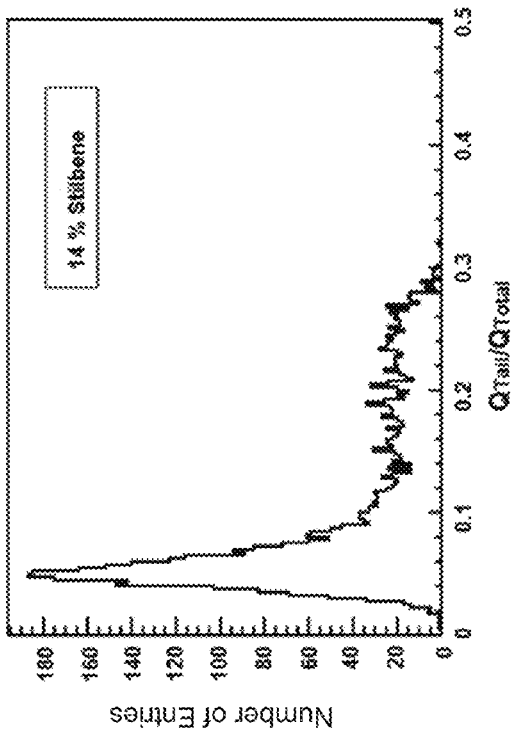
FIGS. 6A through 6C show PSD patterns used for evaluation of delayed light fractions in mixed diphenylacetylene-stilbene crystals according to various embodiments.
Figure 6B:
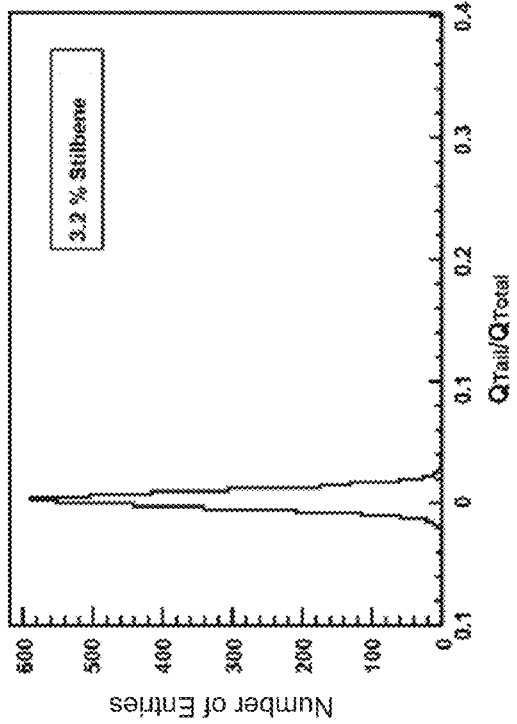
Figure 6C:
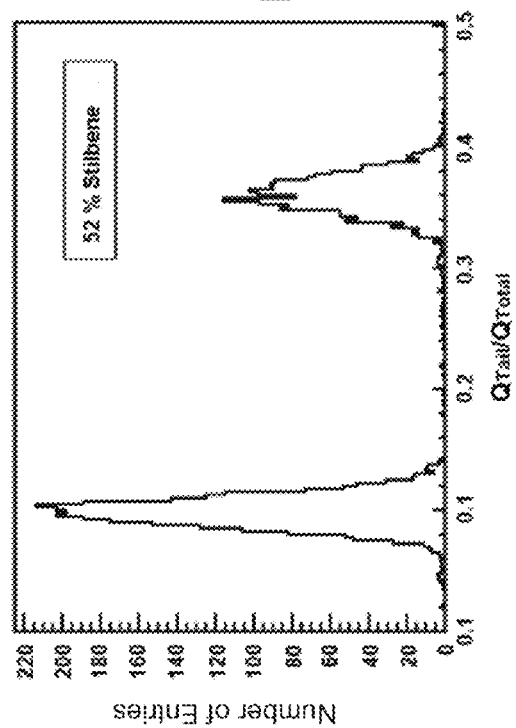

For more detailed consideration of the physical processes giving rise to this nonlinear dependence of the delayed light on chemical composition, the experimental results discussed above were compared in the same γ-equivalent calibrated energy ranges of 500-550 keV, using PSD profiles, typical examples of which are shown in FIGS. 6A-C.

Figure 7:
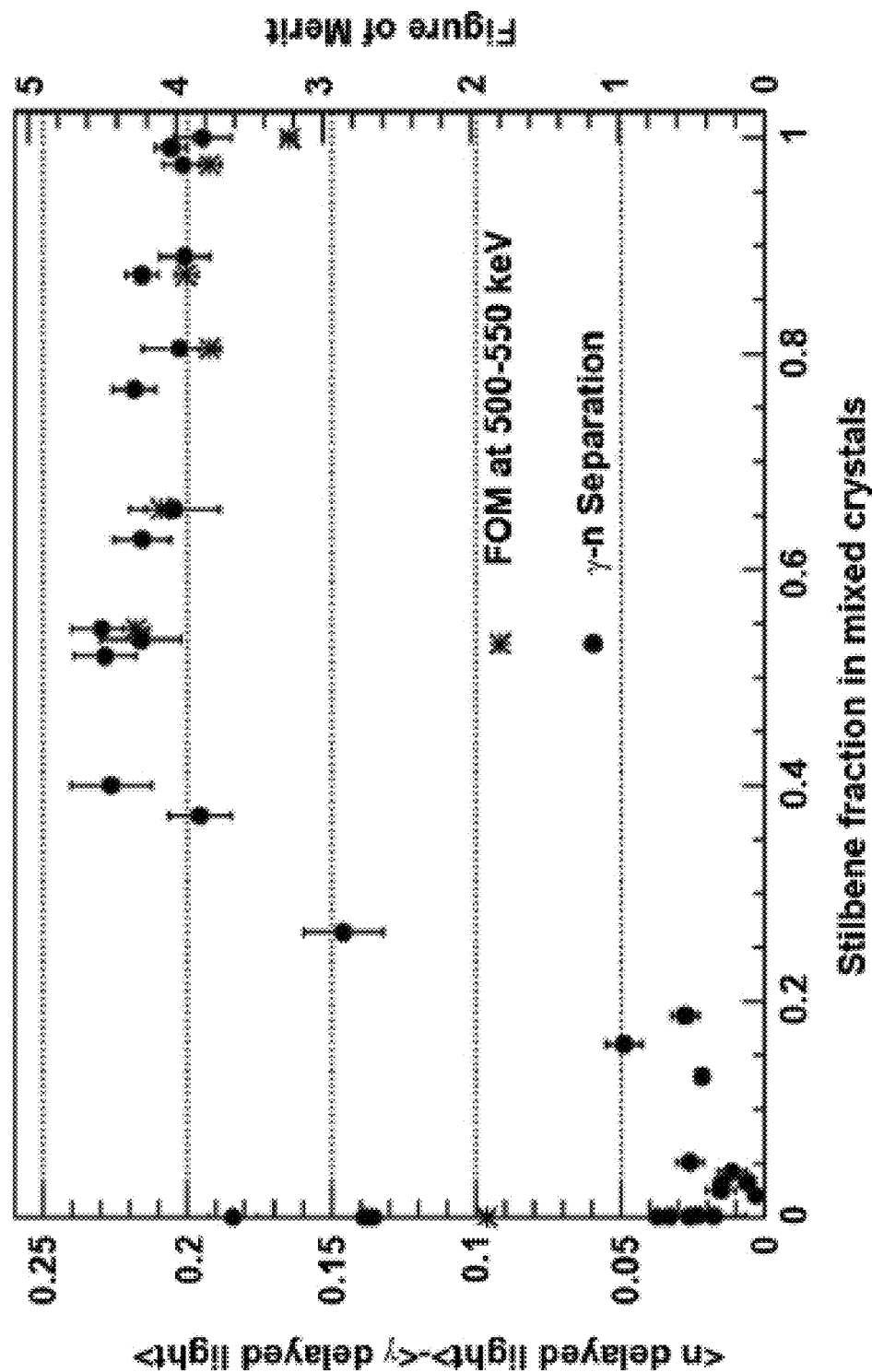
FIG. 7 shows a plot of the neutron/gamma separation and figure of merit versus stilbene fraction in mixed diphenylacetylene-stilbene crystals according to one embodiment.

FIG. 7 depicts one approach where the dependence of the delayed light fraction is calculated for the mixed field of $^{252}$Cf excitation as a function of stilbene concentration measured in a large number of DPAC-stilbene single crystals. The left vertical axis displays the neutron/gamma delayed light separation, represented by S in FIG. 2C, as a function of stilbene fraction (or 1-DPAC fraction). The separation corresponds to a difference between the mean delayed light fraction, $Q_{Tail}/Q_{Total}$, for neutrons and gammas taken as a distribution for a large number, generally 40,000, of waveform acquisitions. $Q_{Tail}$ represents the integral of the PMT baseline subtracted waveform from 65 to 1750 ns, where the peak sample sets the 0 time. $Q_{Total}$, represents the integral from −75 to 1750 ns. The timing values were selected to produce approximately the best neutron/gamma PSD figure of merit (FOM) for high stilbene concentrations, as shown in FIG. 2C.

Since many of the crystals may be too small for accurate energy calibration, comparison of separations at different energies between samples may be the largest source of error in some embodiments. For each data point shown in FIG. 7, corresponding to an individual single crystal, the waveforms were grouped into five or six subsets corresponding to uncalibrated energy bins of roughly equal statistics, and a separation measurement was performed for each subset. The vertical error bars of each point indicate the standard deviation, $\sqrt{1/n\Sigma_{i=1}^{n}(x_i-\bar{x})^2}$, of the subset separation measurements. Several of the crystals disclosed herein showed clearly anomalous PSD patterns, which may be indicative of structural or chemical inhomogeniety.

One significant issue in $^{252}$Cf mixed field data analysis is that it may be difficult to know for certain on an event by event basis, if the waveform was generated by a neutron or a gamma, particularly for the 0.2% to 20% stilbene region, which exhibits little to no PSD. To mitigate the effects of remaining inhomogeniety and low PSD samples, the mean amount of delayed light for neutron stimulations may be estimated by first subtracting off an estimate of the generally more Gaussian gamma component in some approaches. The low $Q_{Tail}/Q_{Total}$ region of the distribution may be fitted with a Gaussian, and the Gaussian subtracted from the total $Q_{Tail}/Q_{Total}$ distribution. The mean of the remaining distribution may be taken as a measure of the neutron delayed light, and the mean of the fitted Gaussian may be taken as a measure of the mean gamma delayed light.

Figure 8:
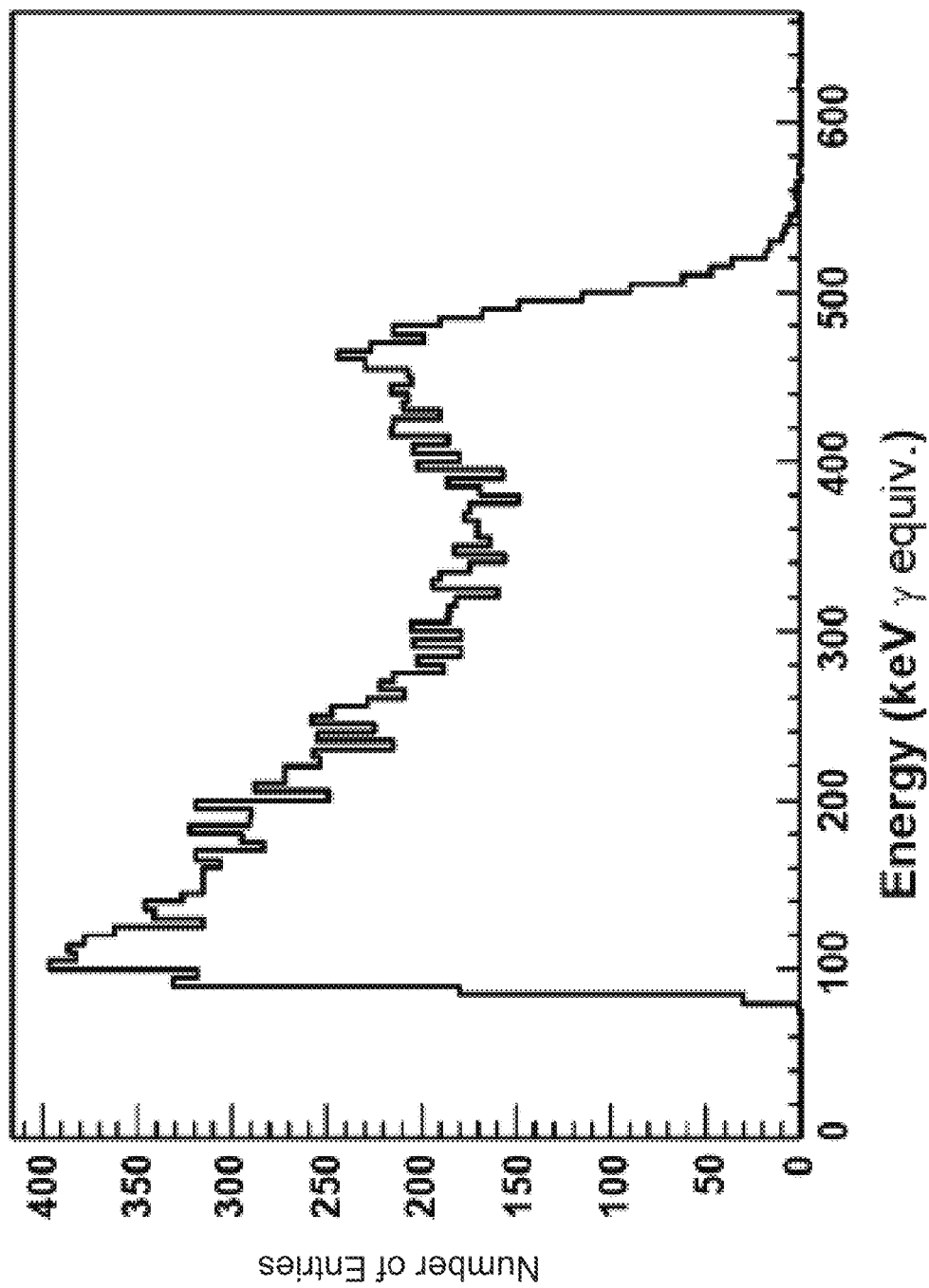
FIG. 8 shows a plot of a $^{137}$Cs spectrum showing Compton edge according to one embodiment.

The gamma/neutron separation may additionally be calculated in terms of the FOM for crystals that had a good $^{137}$Cs Compton edge and exhibited good PSD, as shown in FIG. 8 according to another embodiment. These FOM values for 500-550-keV gamma equivalent (near the $^{137}$Cs Compton edge) as measured from double Gaussian fits of the $Q_{Tail}/Q_{Total}$ distributions are included in FIG. 7 with the corresponding right vertical axis. The vertical errors are based on uncertainties from the fitter routine for the mean and width parameters of the double Gaussian fit propagated through the FOM formula. In various embodiments, the data of FIG. 7 show an absence of neutron/gamma separation and PSD in the region of low stilbene concentrations followed by a sudden onset of delayed light at approximately 20% stilbene, as well as a maximum delayed light fraction soon after the sudden increase.

Although unexpected because of stilbene acting as a PSD quenching impurity, the initial effect of PSD disappearance in DPAC-stilbene mixed crystals may be understood on the basis of energy transfer phenomena studied previously in various mixtures of organic scintillators. In the mixed crystals, the impurity molecules with lower energies of the excited states may act as traps for both singlet and triplet excitations of the host. Calculations of the triplet excitation energies made herein find that stilbene has a smaller $T_1$ triplet excitation energy (2.4 eV) than DPAC (2.7 eV). As a result, stilbene molecules may act as traps that prevent the DPAC triplet energy migration and annihilation needed for the formation of delayed light in DPAC crystals containing stilbene in small concentrations, corresponding to "no PSD" regions as shown in FIGS. 5 and 7.

According to some embodiments, mixed DPAC-stilbene crystals containing higher stilbene concentrations may result in observation of unexpected broadening of the experimental patterns, followed by a sharp rise of the PSD [FIG. 5C-D] at a certain threshold stilbene concentration (~20% in FIG. 7). The sudden reappearance of the delayed light may correspond to a restored exciton mobility resulting from the increased concentration of stilbene. The phenomenon may be similar to other mixed systems, where a sudden rise of certain properties was studied by application of the percolation theory. Percolation is a well-known phenomenon first observed for combined mixtures of metal and plastic spheres in which conductivity suddenly appears at a threshold volume fraction of the conductive metal spheres. It is described as a geometric-statistical phenomenon whereby at the percolation threshold the probability of the existence of at least one infinite conductive cluster of metal balls becomes unity. Without wishing to be bound by any theory, it is believed that an analogous situation may arise with respect to mixed crystals containing stilbene, where there may exist an infinite "conductive" cluster of stilbene molecules also having a percolation threshold where the triplet excited states can reach each other to incur the triplet-triplet annihilation and generate delayed singlet emission.

From the basic principles of percolation, the reappearance of the delayed light may be due to attaining the percolation threshold in exciton migration. For example, in embodiments involving "pure" DPAC, even if stilbene is present at very low concentrations, less than ≈1%, the average distance between stilbene traps may be much larger than the excitation density, and so the host excitation may still migrate producing triplet recombination needed for the formation of the delayed light and PSD in the initial DPAC crystals, as shown in FIGS. 5A and 7. In other embodiments involving slightly higher stilbene concentrations (before the percolation threshold), traps may capture all host triplet excitations. The triplets, however, may not interact because of the still large distances between stilbene molecules, acting as triplet exciton traps, thus leading to a quenched migration, recombination and absence of PSD, as shown in FIGS. 5B and 7 below 20%. When the concentration of stilbene in the mixed crystal becomes large enough in other embodiments, high trap density may lead to a dramatically increased probability of stilbene network formation. Then, the stilbene traps may act as an excitation transport medium resulting in a sudden rise of PSD. And finally in further embodiments, when the stilbene network reaches infinite dimensions required for the efficient triplet migration and interaction, the scintillation pulses may become more uniform, resulting in clear peak separation, which goes through a maximum followed by a slow drop with increasing stilbene concentrations beyond 50%.

Figure 9:
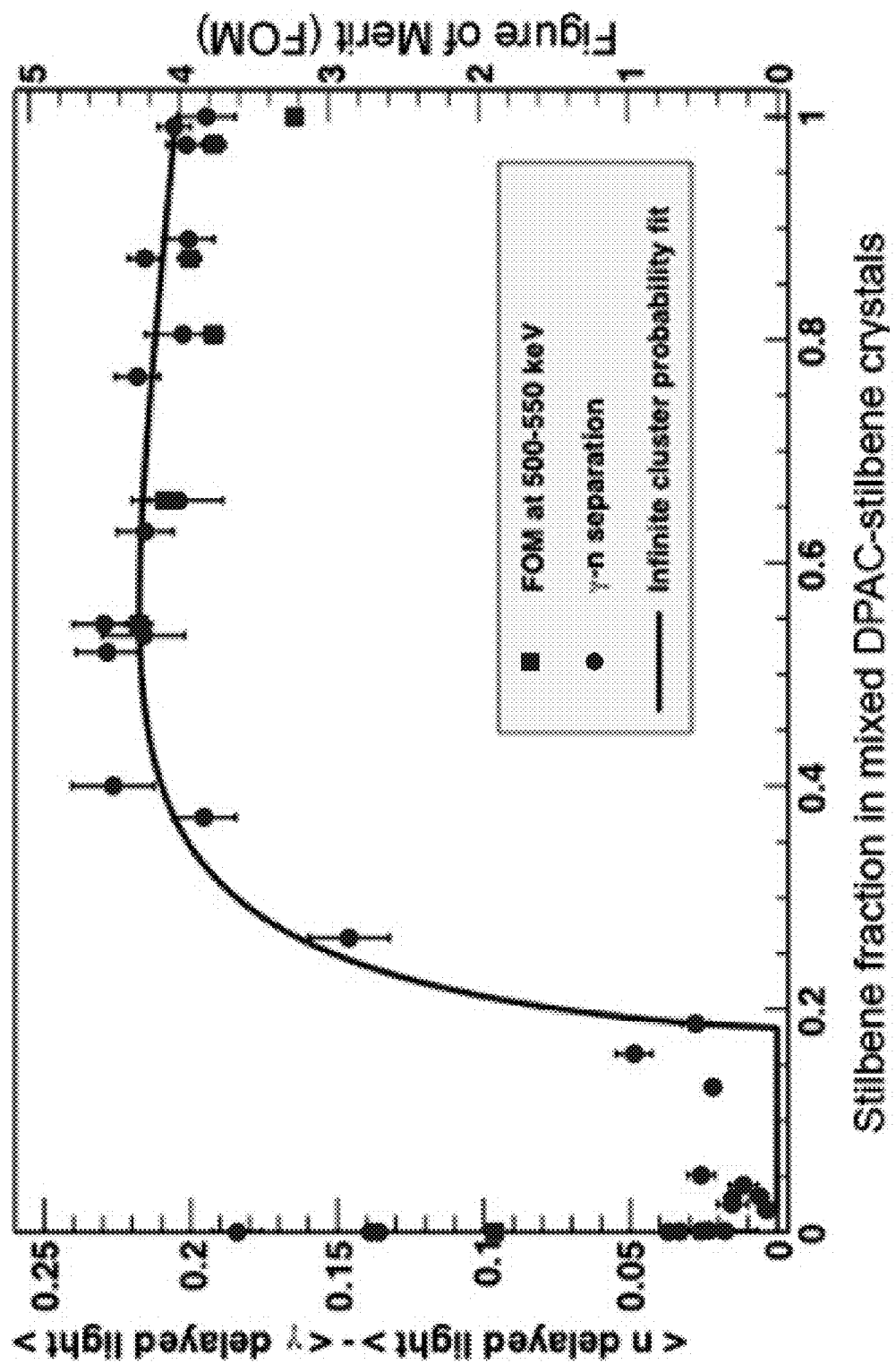
FIG. 9 shows a plot of the average amount of delayed light versus stilbene fraction in mixed diphenylacetylene-stilbene crystals obtained from $^{137}$Cs gamma stimulations according to one embodiment.

FIG. 9 displays a similar dependence of the delayed light from triplet excitation annihilation calculated for pure gamma excitations in the same sets of the mixed DPAC-stilbene crystals according to yet another embodiment. The data displayed in FIG. 9 were obtained using nearly the same method as used with the $^{252}$Cf source, except the vertical axis of FIG. 9 corresponds to the mean of the $Q_{Tail}/Q_{Total}$ distributions for $^{137}$Cs gamma stimulations. As shown, the fraction of delayed light shows a clearer maximum; there is ~50% more delayed light for a 65:35% DPAC-stilbene crystal than for pure stilbene.

FIG. 9 also includes a fit based on the function for infinite cluster probability from the percolation theory combined with dropping effective triplet concentration. The functional form is $y=a(x-x_c)^b/x$ for $x>x_c$ and 0 otherwise. The best-fit parameters from a $\chi^2$ minimization are $a=0.0833$, $x_c=0.187$, and $b=0.386$. The pure percolation theory does not include the 1/x factor. This factor may be added to account for the effect that once the concentration is high enough to form a fully connected stilbene network, additional stilbene decreases the effective triplet concentration. The percolation threshold, $x_c$ is in the range of FCC site fraction (0.198) and BCC bond fraction (0.1803) percolation, while the critical exponent, b, is relatively close to the value of 0.41 expected for 3-dimensional percolation. This simplified model may model the emissions from stilbene so the delayed light from DPAC at the lowest stilbene fractions is not included.

Figure 10:
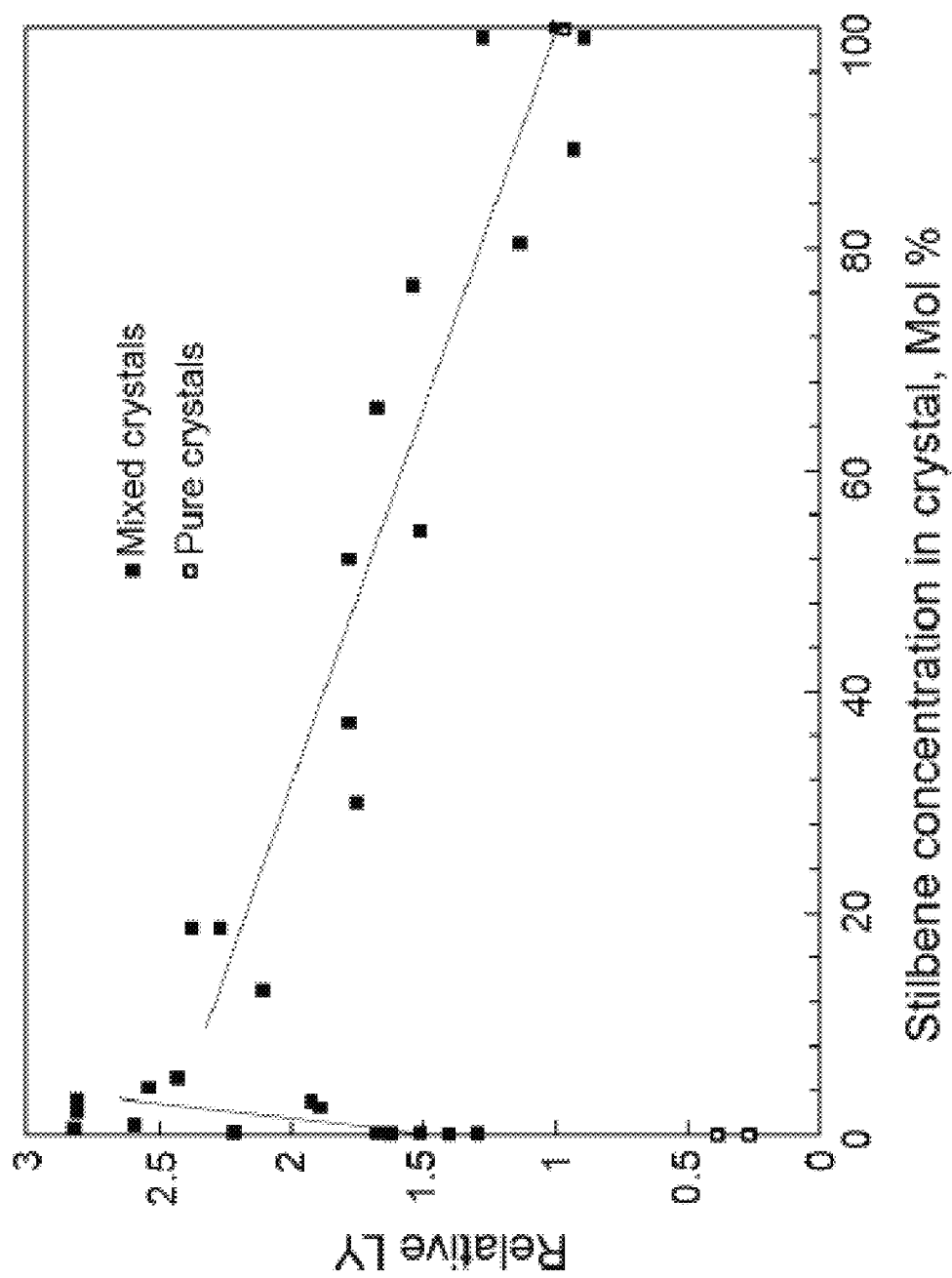
FIG. 10 shows a plot of the scintillation light yield versus stilbene concentration in mixed diphenylacetylene-stilbene crystals obtained from $^{137}$Cs gamma stimulations according to one embodiment.

Referring now to FIG. 10, the scintillation light yield (LY) measured in the mixed DPAC-stilbene crystals of different composition is shown according to a further embodiment. The LY of a pure stilbene crystal grown from the same material as in the mixtures was taken as a reference point of a unit (corresponding to about 13,000 Ph/MeV). The large scatter of the experimental data may result from the difference in size (meaning different extent of self-absorption) and insufficient optical quality of crystals grown by the evaporation technique. However, measurements made with large number of crystals, obtained in several independent sets of growth experiments show a clearly pronounced dependence, in which a relatively modest LY of pure DPAC crystals sharply increases almost by an order of magnitude with very small additions of stilbene, and then gradually decreases, with the changing composition, to the LY of pure stilbene.

Without wishing to be bound by any theory, it is believed that these trends observed in the LY may be explained on the basis of classical understanding of energy transfer phenomena influencing the emission efficiency in the mixed organic scintillators. As mentioned above, the impurity molecules with the lower energy band gaps may trap both singlet and triplet excitons of the host that absorbs most of the initial excitation. Fast de-excitation of the trapped singlet states may then occur in a regular way, producing scintillation corresponding to the relative efficiency of the host and impurity molecules. Based on this mechanism, the initial excitation energy of wider bandgap DPAC may be transferred to stilbene present in the host as impurity. It is further believed that the increased LY in the mixed DPAC-stilbene crystals may result from the singlet emission of stilbene molecules, which are posited to have higher quantum efficiency than DPAC molecules. The mechanism may be supported by the observation that the photoluminescence spectra of the mixed DPAC-stilbene crystals with enhanced LY resemble more the stilbene, rather than the DPAC spectrum. Furthermore, the spectra of the mixed crystals exhibit a slight blue-shift in comparison to the spectra of pure stilbene crystals, as shown in FIG. 4C, reflecting, most likely, the transformation of stilbene molecules from their bonded state in a pure stilbene crystal to the state of single fluorescing molecules distributed in DPAC. By analogy with liquid scintillators, in the mixed DPAC-stilbene system, stilbene may act as a solute, producing the more efficient scintillation because of decreased self-absorption in the diluted state. Due to energy-dependent photon statistics, the higher LY efficiency may also be reflected in the enhanced PSD produced by the stilbene network in the mixed crystals.

Various applications of the aforementioned results are also discussed herein. The DPAC-stilbene system is a rare compound, which can form mixed crystals in large range of concentrations because of the close similarity of their molecular and crystal structures. The observations described herein indicate that small additions of longer wavelength impurities may not always lead to the quenched PSD (p-terphenyl doped by 1,4-diphenyl-1,3-butadiene). However, DPAC-stilbene system already may be helpful for a better understanding of the experimental problems identified in the literature and earlier works. As shown by a few examples described below, the results also may be useful for practical applications leading to the development and engineering of new materials.

The results presented herein correct a previously accepted opinion that DPAC has a negligible delayed component of the scintillation emission and therefore is unsuitable for PSD. Pure diphenylacetylene has PSD, as shown in FIG. 5A, in this respect not being very different from stilbene or other hydrocarbon compounds of similar structure. FIG. 7 shows that the mean $Q_{Tail}/Q_{Total}$ separation for pure DPAC is similar to crystals with high stilbene concentration. The corresponding FOM, however, is significantly lower. This may be consistent with DPAC having a lower light yield. Based on the results of these studies and without wishing to be bound by any particular theory, it is believed that the actual scintillation efficiency of DPAC discussed in conflicting reports previously is inferior to that of stilbene, because all pure diphenylacetylene crystals, defined by chemical analysis or presence of PSD, showed a LY (gamma, beta, and PL) almost an order of magnitude lower than in stilbene crystals.

Figure 11:
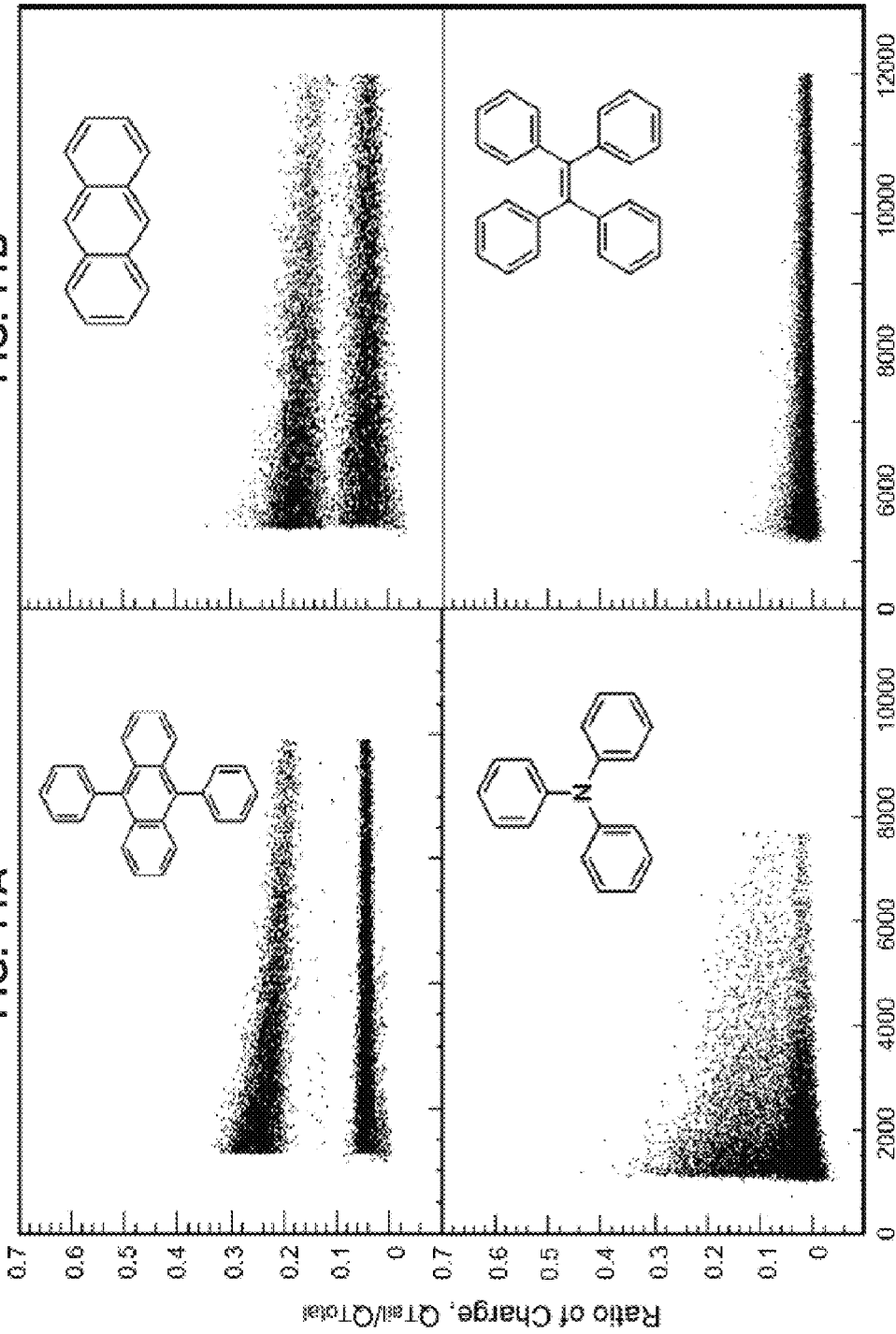
FIGS. 11A through 11D show PSD plots of the ratio of charge from delayed emission versus pulse height for various new organic crystals according to some embodiments.

Now referring to an interpretation of PSD in newly tested materials, studies made with the DPAC-stilbene system may enable better understanding and interpretation of the results obtained in the PSD study of new organic crystals. A number of new materials with PSD close or even superior to stilbene, are shown in FIG. 11A according to some embodiments. The majority of the measured PSD patterns, the most typical examples of which are shown in FIG. 11, did not exhibit any visible relation between the PSD and molecular or crystallographic structures of the tested materials. Again not wishing to be bound by any theory, it may now be understood that a complete absence of PSD or "bad PSD," similar to that shown in FIGS. 11B-D, does not reflect intrinsic discrimination properties, but may result from strong effects of impurities. Commercially produced organic materials may only have 95%-98% purity. Further purification of such materials may be especially difficult in the case of close similarity of the host and impurity molecules.

Again, not wishing to be bound by any one theory, it is believed the controversy in earlier studies regarding delayed light in DPAC crystals likely resulted from the fact that stilbene is typically used as the initial starting material for DPAC synthesis. Commonly introduced in DPAC during synthesis, stilbene may be very difficult to remove by recrystallization because of its preferential incorporation into crystals. Similar situations may be observed in other mixtures of organic scintillating materials.

Figure 12:
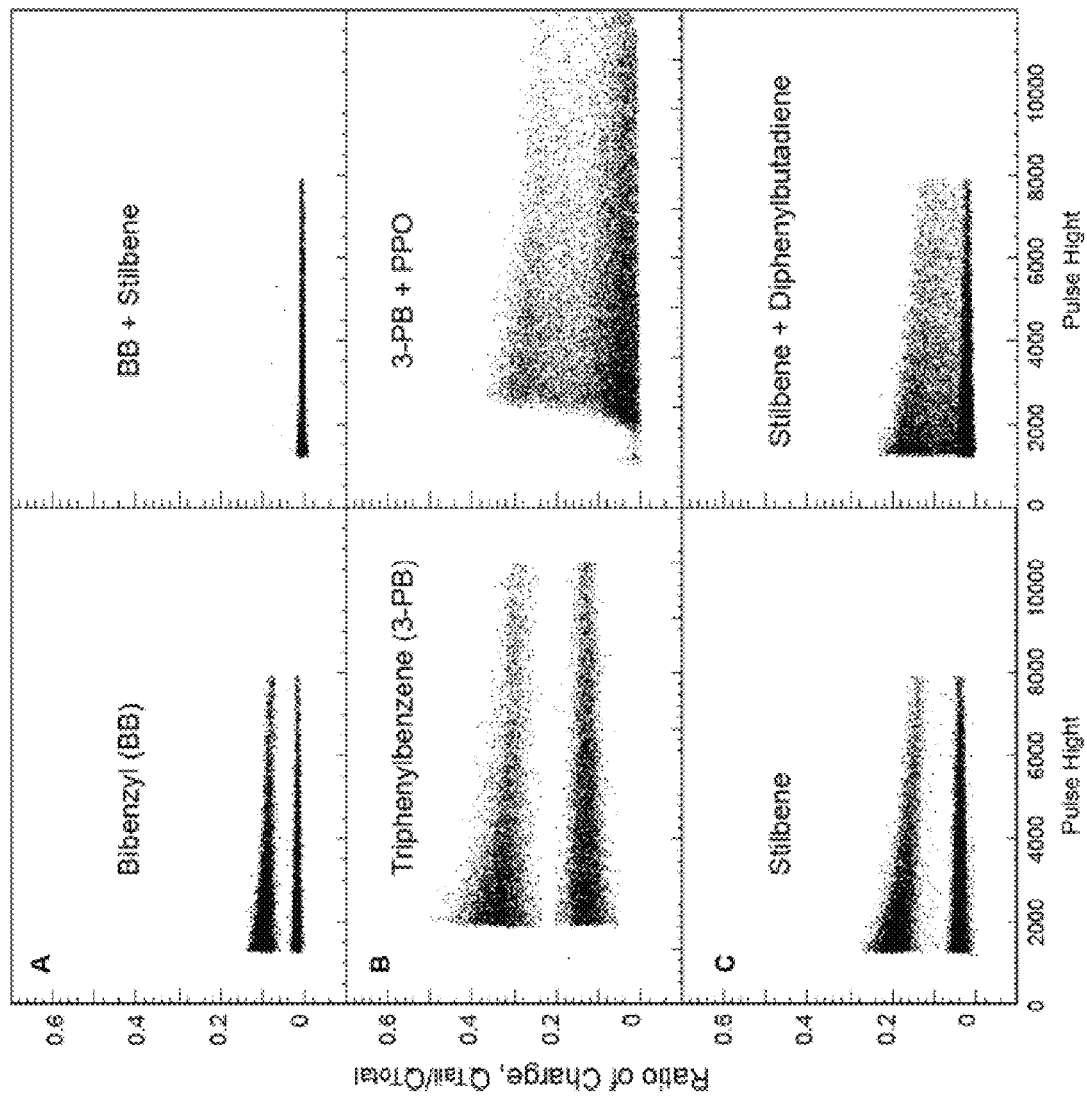
FIG. 12A shows PSD plots of the ratio of charge from delayed emission versus pulse height for pure bibenzyl and mixed bibenzyl-stilbene crystals according to various embodiments.
FIG. 12B shows PSD plots of the ratio of charge from delayed emission versus pulse height for pure triphenylbenzene (3-PB) and mixed 3-PB-2,5-diphenyloxazole (PPO) crystals according to various embodiments.
FIG. 12C shows PSD plots of the ratio of charge from delayed emission versus pulse height for pure stilbene and mixed stilbene-diphenylbutadiene crystals according to various embodiments.

Now referring to FIG. 12, the deterioration of the initially good PSD produced as a result of the addition of lower-bandgap impurities in some organic crystals is shown according to various embodiments. As shown by the example of the bibenzyl (BB)-stilbene crystals in FIG. 12A, small concentrations of impurities may cause a complete suppression of the delayed light and PSD not only in DPAC-stilbene, but also in other mixed crystals. In a set of very similar molecules (bibenzyl, diphenylacetylene and trans-stilbene), bibenzyl has the shortest wavelength of emission (widest band gap). Similar to the dependence shown in FIG. 10, small additions of stilbene to BB crystals may also be accompanied by a noticeable increase in its scintillation LY, indicating higher scintillation efficiency of stilbene in comparison to BB. On the contrary, when mixed BB-DPAC crystals are grown with small concentration of DPAC, the LY of the resulting crystals may drop significantly, supporting once more one hypothesis that DPAC may have lower scintillation efficiency than stilbene. Depending on the kind and concentration, the impurities may lead to deterioration of PSD properties producing scintillation with a large fraction of delayed light, but poor separation between gamma and neutron events, as shown in FIGS. 1B, 11C and 12B.

And finally, an interesting and surprising result of these experiments is that even stilbene discrimination properties may be spoiled by the presence of a small amount of closely structured 1,4-diphenyl-1,3-butadiene as shown in one approach in FIG. 12C. Such a result may indicate that historically known excellent PSD of stilbene may most likely be determined by the fact that it does not typically end up with "PSD killing" impurities during its synthesis.

With regard to new single crystal scintillators with enhanced PSD performance, identification and production of said scintillating materials that can be used for efficient neutron/gamma discrimination is one important goal of the conducted studies. As shown in FIG. 5, both DPAC and stilbene have PSD that may be suitable for use in neutron detectors. However, the mixed DPAC-stilbene crystals containing stilbene in concentrations above 30%-40% may offer performance better than pure crystals. While in large pure stilbene crystals, self-absorption may reduce the effective light yield, this problem may be much less pronounced in mixed DPAC-stilbene crystals of the same size. Thus, mixed DPAC-stilbene crystals with intermediate stilbene concentration corresponding to the highest LY and maximum PSD may be good candidates for efficient detector applications.

It should be noted, however, that scaling-up growth of these crystals is not a trivial task, because prior to this disclosure, solution growth techniques were used mainly for production of large crystals soluble in water. However, fully faceted DPAC-stilbene crystals may be grown in some approaches from a pure organic solvent (anisole) using the rapid growth technique developed for growth of large KDP crystals. The encouraging results may indicate that larger and better quality single crystals may be grown with further development of the solution growth technique now applied to pure organic systems.

It is also important to note that selection of such mixed systems should not be necessarily limited to the DPAC-stilbene combination. For example, it may be extended to other organic compounds that, grown from solution or melt, may form mixed crystals. Examples of such combination may include aromatic compounds with similar molecules, including but not limited to naphthalene and anthracene, biphenyl and p-terphenyl, p-terphenyl and p-quaterphenyl, etc., differing by the number of phenyl rings and, therefore, by the bandgap energy. These similar compounds may form practically identical crystallographic structures, in which the scintillation efficiency changes may be combined with the variations of PSD that may be used for the engineering of new neutron detection materials.

Furthermore, the understanding of the PSD mechanisms in mixed crystals may be used for producing scintillators with almost no delayed light, generally referred to as low-afterglow scintillators. The use of organic scintillators with very low afterglow is important for ion and neutron spectrometry at high intensity pulsed laser facilities, which require separation of temporally close signals, particularly in cases when the delayed signals are significantly smaller than the earlier produced signals. Neutrons with different energies may be separated by the time-of-flight method, which uses different velocities of neutrons traversing down a flight path. For example, separation of 14-MeV neutrons produced in a fusion reaction from the 10-12-MeV neutrons scattered in the high-density compressed target requires fast organic scintillators with a minimized fraction of the delayed light not exceeding $10^{-3}$ of peak intensity 30 ns after the primary signal. Liquid scintillators containing dissolved molecular oxygen known for its ability to suppress the delayed light via efficient quenching of the excited triplet states responsible for the slow scintillation component have the disadvantage that, even if the desired short decays are reached in the liquid scintillators, the presence of molecular oxygen leads to simultaneous suppression of not only the delayed, but also the prompt component of fluorescence, resulting in total decrease of the scintillation efficiency essential for high-resolution neutron spectrometry.

Figure 13:
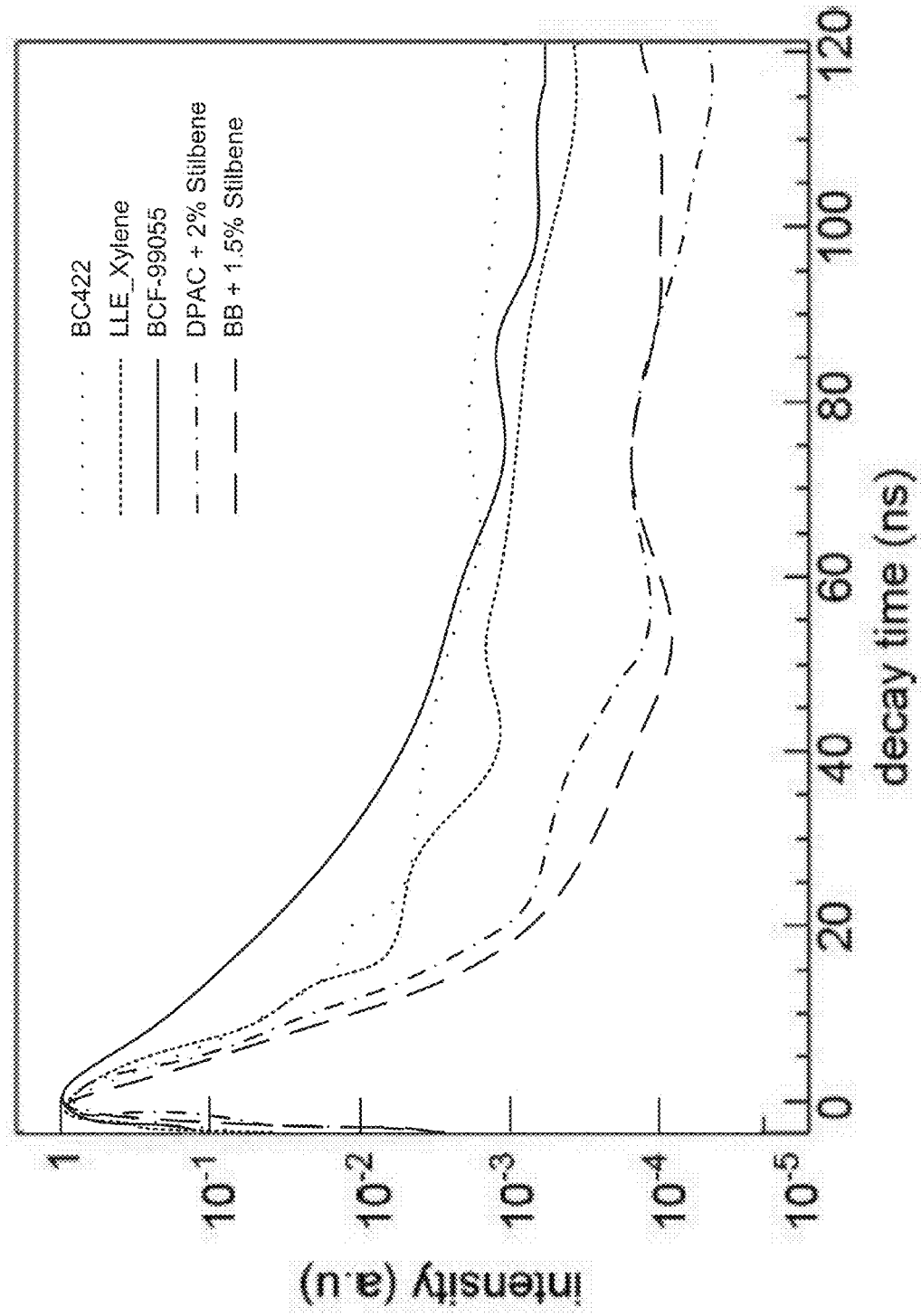
FIG. 13 shows a plot of decay curves for plastic scintillators, liquid scintillators, diphenylacetylene single crystals and bibenzyl single crystals according to one embodiment.
Figure 14:
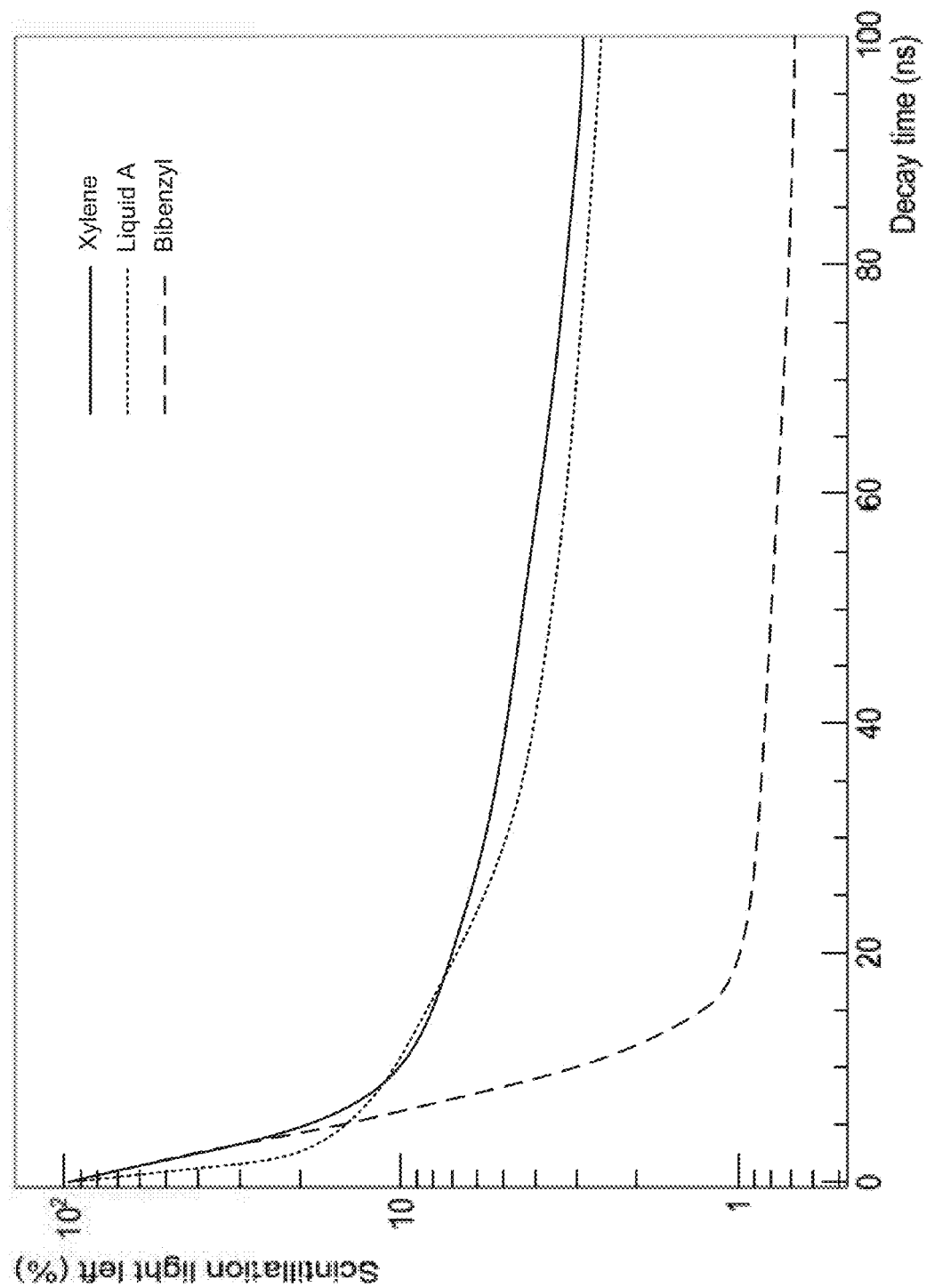
FIG. 14 shows a plot of decay curves for a xylene neutron time-of-flight detector, a liquid scintillator and a bibenzyl crystal containing 2% stilbene according to one embodiment.

In some approaches discussed herein, absence of PSD in the mixed DPAC-stilbene crystals may also be caused by suppression of the delayed light, therefore leading to a sharp decrease of the scintillation decay times. For example, DPAC-stilbene (as shown in FIG. 5B) or bibenzyl-stilbene (as shown in FIG. 12A] single crystals without PSD may have lower fraction of delayed light than oxygen-quenched liquid scintillators (as shown in FIGS. 13 and 14).

Another attractive feature of the single crystals described herein is that the addition of impurities used to suppress the delayed light may not necessarily produce any quenching effect on the prompt component of fluorescence, but on the contrary, may lead to the enhancement of the scintillation LY in various approaches. Since both suppression of the delayed light and increase in the scintillation efficiency may be obtained at very small additions of quenching impurities, different combinations of host-impurity systems may be produced depending on the requirements to decay times, brightness, and wavelengths of emission.

As discussed above, pulse shape discrimination (PSD) properties utilized for detection of high-energy neutrons were studied with a number of new organic crystals produced by solution growth. A model system of mixed diphenylacetylene-stilbene single crystals of different compositions was studied to learn about the physical phenomena of excited state migration and annihilation leading to the formation of delayed light and PSD in organic materials. Without wishing to be bound by any particular theory or mechanism, it is believed that the presence of impurities with lower bandgap energies may be a major factor influencing PSD properties of organic materials in numerous approaches. Due to trapping effects, very small concentrations of such impurities in a host crystal may substantially decrease the rate of triplet excited state migration, leading to a sharp decrease in the decay times and complete disappearance of PSD. At a higher concentration of an impurity, PSD may appear at a level exceeding that of the PSD typical for both pure host and impurity. The concentration of the PSD reappearance may be consistent with a percolation threshold resulting from the formation of a network of impurity molecules that enables triplet energy migration. This surprising and new understanding of the energy migration processes in complex systems resulted in growth of new organic scintillators with controlled decay characteristics. Crystals with a large fraction of delayed light may be used for high-energy neutron detection via improved PSD, while crystals with suppressed delayed light may be of interest for further development as low-afterglow scintillators for different applications.

It is important to note that the experiments, results and discussions/interpretations thereof are not meant to limit the scope of the invention in any way. The experiments conducted are reported to provide examples of crystal growth; organic scintillator crystals, which exhibit good PSD and/or are useful for other applications; organic scintillator crystals which do not exhibit PSD, but are useful nonetheless for neutron detection, etc. Many other embodiments of organic scintillator crystals exhibiting the aforementioned PSD properties, and the methods for growing said crystals, may be possible, and are only to be limited by the scope of the claims.

According to one embodiment of the invention, a method includes growing an organic crystal from solution, the organic crystal having a physical property of exhibiting a signal response signature for neutrons from a radioactive source. In some embodiments, the solution which the organic crystal is grown from may be comprised of a solvent and a solute.

Preferred solvents include common solvents such as water, alcohol, and toluene, though other solvents can be used. In illustrative approaches, the solution may include at least one of water, an alcohol, an ether, an ester, and a derivative of benzene. The solvent may comprise more than 30% of the solution.

Many types of materials may form the solute that can be grown into an organic crystal, including those that have the physical property of generating a signal response for neutrons, and may be combined in various embodiments.

Some exemplary materials include 1,3,5-triphenyl benzene, 1-1-4-4-tetraphenyl-1,3-butadiene, 1-4-diphenyl-1-3-butadiene, 9,10-diphenylanthracene, 9-phenylanthracene, diphenylacetylene, 2-fluorobiphenyl-4-carboxylic acid, 4-biphenylcarboxylic acid, and n-phenylanthranilic acid. In some further embodiments, the organic crystal may include a material selected from a group consisting of 1-3-5-triphenyl benzene, 1-1-4-4-tetraphenyl-1-3-butadiene, 1-4-diphenyl-1-3-butadiene, 9-10-diphenylanthracene, 9-phenylanthracene, diphenylacetylene. 2-fluorobiphenyl-4-carboxylic acid, 4-biphenylcarboxylic acid, and n-phenylanthranilic acid. It should be kept in mind that the foregoing list is nonexclusive.

In some approaches, the organic crystal may include one or more benzene and/or phenyl rings. Generally, only a lone benzene ring is referred to as benzene, while a benzene ring with another group is referred to as a phenyl ring. Some exemplary materials which include one or more benzene and/or phenyl rings include benzene, phenyl, salicylamide, tetraphenylbutadiene, triphenylbenzene, etc.

In more approaches, the organic crystal may include stilbene or a stilbene derivative. For example, stilbene may be included in the grown organic crystal to take advantage of the PSD properties of stilbene. This allows for readily available growth techniques to produce large quantities of organic crystals including the PSD properties of stilbene, without the drawbacks of long wait times and/or high costs needed to obtain stilbene from distributors.

In still more approaches, the organic crystal may include a salt of an aromatic acid. For example, a salt of an aromatic acid may include ammonium salicylate, sodium salicylate, etc. In further approaches, the organic crystal may include lithium salt of an aromatic acid, such as lithium salts of 3-phenylsalicylic, or 2-fluorobiphenyl-4-carboxylic acids.

In one approach, the organic crystal may include lithium salicylate.

In various approaches, the solution may be held at a temperature that is less than that of the melting point of the solute during the growing. Illustrative approaches include growing the organic crystal by solvent evaporation at a constant temperature held between about 25° C. and about 100° C., or by temperature reduction within the range between about the boiling and freezing points of a corresponding solvent.

According to some approaches, the organic crystal may have a length of greater than about 1 mm in one dimension. For example, the organic crystal may have dimensions of 1.1 mm×0.5 mm×0.7 mm. In more approaches, the organic crystal may have a length of greater than about 5 mm in one dimension, and in even more approaches, the organic crystal may have a length of greater than about 25 mm in one dimension. Of course, organic crystals with more or less length in one dimension may be used with the present method.

In some preferred embodiments, the signal response signature may include a time-delayed luminescence characteristic of neutrons interacting with the organic crystal relative to a luminescence characteristic of gamma rays interacting with the organic crystal.

Any of the methods described above may be included in one or more systems. For example, a system may include an organic crystal having physical characteristics of formation from solution or melt growth, the organic crystal having a physical property of exhibiting a signal response signature for neutrons from a radioactive source. The system may further include a photodetector for detecting the signal response of the organic crystal. This system may be useful for detection of radioactive substances, determination of the strength of radioactive emanations from a radioactive substance, etc.

In some embodiments, the organic crystal used in the system may have a physical characteristic of exhibiting faceted growth typical of solution growth on the faces of the organic crystal.

In more approaches, the organic crystal may include one or more benzene and/or phenyl rings. Any of the materials described herein may be used in the system as well.

In more approaches, the organic crystal may include stilbene, may include a derivative of stilbene, and/or may include a material selected from a group consisting of 1-3-5-triphenyl benzene, 1-1-4-4-tetraphenyl-1-3-butadiene, 1-4-diphenyl-1-3-butadiene, 9-10-diphenyl-anthracene, 9-phenylanthracene, diphenyl acetylene, 2-fluorobiphenyl-4-carboxylic acid, 4-biphenylcarboxylic acid, and n-phenylanthranilic acid.

In some approaches, the organic crystal may include a salt of an aromatic acid. In further approaches, the organic crystal may include lithium salt of an aromatic acid. Also, the organic crystal may include lithium salicylate.

In even more embodiments, the organic crystal may have a length of greater than about 1 mm in one dimension, a length of greater than about 5 mm in one dimension, a length of greater than about 25 mm in one dimension, etc. Of course, the organic crystal may have a length in one dimension of greater than or less than the dimensions described herein.

The signal response signature, according to some preferred embodiments, may include a delayed luminescence characteristic of neutrons interacting with the organic crystal relative to a luminescence characteristic of gamma rays interacting with the organic crystal.

Also, the system may further comprise a processor for processing an output of the photodetector using pulse shape discrimination for differentiating responses for neutrons and gamma irradiation.

In another embodiment of an organic crystal, the organic crystal may comprise an organic crystal having physical characteristics of formation from solution. In yet another embodiment, the organic crystal may comprise an organic crystal having physical characteristics of formation from melt growth (e.g. Bridgman or Czochralski methods) without any developed facets. Also, the organic crystal has the physical characteristic of exhibiting a signal response signature for neutrons from a radioactive source. The organic crystal may also has a length of greater than about 1 mm in one dimension.

In some more embodiments, the organic crystal may include one or more benzene and/or phenyl rings. Also, the organic crystal may include a material selected from a group consisting of 1-3-5-triphenyl benzene, 1-1-4-4-tetraphenyl-1-3-butadiene, 1-4-diphenyl-1-3-butadiene, 9-10-diphenyl-anthracene, 9-phenylanthracene, diphenylacetylene (DPAC), 2-fluorobiphenyl-4-carboxylic acid, 4-biphenylcarboxylic acid, and n-phenylanthranilic acid.

In more embodiments, the organic crystal may include a salt of an aromatic acid and/or a lithium salt of an aromatic acid.

In a further embodiment, the organic crystal may include bibenzyl, also known as (1,2-diphenylethane). For example, one preferred embodiment includes bibenzyl-stilbene.

Another preferred embodiment includes DPAC-stilbene.

In more approaches, the organic crystal may have a length of greater than about 1 mm in one dimension, more preferably about 5 mm in one dimension, and in some approaches the length may be greater than about 25 mm in one dimension.

According to another embodiment of the invention, a mixed organic crystal includes a single mixed crystal having at least two compounds with different bandgap energies. In addition, the organic crystal has a physical property of exhibiting a signal response signature for neutrons from a radioactive source, where the signal response signature does not include a significantly-delayed luminescence characteristic of neutrons interacting with the organic crystal relative to a luminescence characteristic of gamma rays interacting with the organic crystal. In some approaches an insignificant delayed luminescence characteristic of neutrons may correspond to situations where the signal response signature is characterized by a fraction of delayed light not exceeding $10^{-3}$ of a peak intensity 30 ns after a primary luminescence signal. As used herein, the primary luminescence signal may be a flash, a readout by a photodetector, etc.

In another embodiment, the organic crystal may include bibenzyl and stilbene and/or a stilbene derivative. The concentration of the stilbene or stilbene derivative may be in a range of 10-99% (molecular %), in some approaches. In other approaches, the concentration of the stilbene or stilbene derivative may be in a range of 0.05 and 10% (molecular %).

In yet another embodiment, the organic crystal may include diphenylacetylene (DPAC) and stilbene or a stilbene derivative. In some approaches, a concentration of the stilbene or stilbene derivative may be in a range of 0.05 and 10% (molecular %).

According to further embodiments, the organic crystal may include naphthalene and anthracene. In other embodiments, the organic crystal may include biphenyl and p-terphenyl. In more embodiments, the organic crystal may include p-terphenyl and p-quaterphenyl.

Additionally, in one approach the organic crystal may include one or more benzene or phenyl rings. For example, in some approaches, the organic crystal may include a material selected from a group consisting of 1-3-5-triphenyl benzene, 1-1-4-4-tetraphenyl-1-3-butadiene, 1-4-diphenyl-1-3-butadiene, 9-10-diphenyl-anthracene, 9-phenylanthracene, diphenyl acetylene, 2-fluorobiphenyl-4-carboxylic acid, 4-biphenylcarboxylic acid, and n-phenylanthranilic acid.

According to another approach, the organic crystal includes a single mixed crystal having at least two compounds with different bandgap energies, where the at least to compounds may differ by a number of phenyl rings in each.

According to yet another approach, the organic crystal may include a salt of an aromatic acid. In further approaches, the organic crystal may include lithium salt of an aromatic acid and/or lithium salts of 3-phenylsalicylic or 2-fluorobiphenyl-4-carboxylic acids. Also, the organic crystal may include lithium salicylate.

In even more embodiments, the organic crystal may have a length of greater than about 1 mm in one dimension, a length of greater than about 5 mm in one dimension, a length of greater than about 25 mm in one dimension, etc. Of course, the organic crystal may have a length in one dimension of greater than or less than the dimensions described herein.

Furthermore, in some approaches, the organic crystal may have physical characteristics of exhibiting typical faceted growth on the faces of said crystal. In additional approaches, the organic crystal may have physical characteristics of formation from solution or melt growth.

Also, any of the organic crystals described above may be included in one or more systems. For instance, a system may include a mixed organic crystal including a single mixed crystal having at least two compounds with different bandgap energies, the organic crystal having a physical property of exhibiting a signal response signature for neutrons from a radioactive source, where the signal response signature does not include a significantly-delayed luminescence characteristic of neutrons interacting with the organic crystal relative to a luminescence characteristic of gamma rays interacting with the organic crystal. In addition, the system may include a photodetector for detecting the signal response of the organic crystal.

Further, any of the organic crystals described above may be made, produced, generated, grown, etc. according to one or more methods. For example, a method may include growing from solution a mixed organic crystal including a single mixed crystal having at least two compounds with different bandgap energies, the organic crystal having a physical property of exhibiting a signal response signature for neutrons from a radioactive source, where the signal response signature does not include a significantly-delayed luminescence characteristic of neutrons interacting with the organic crystal relative to a luminescence characteristic of gamma rays interacting with the organic crystal.

EXPERIMENTS

Experiment 1

Solution Growth by Slow Evaporation

Figure 15A:
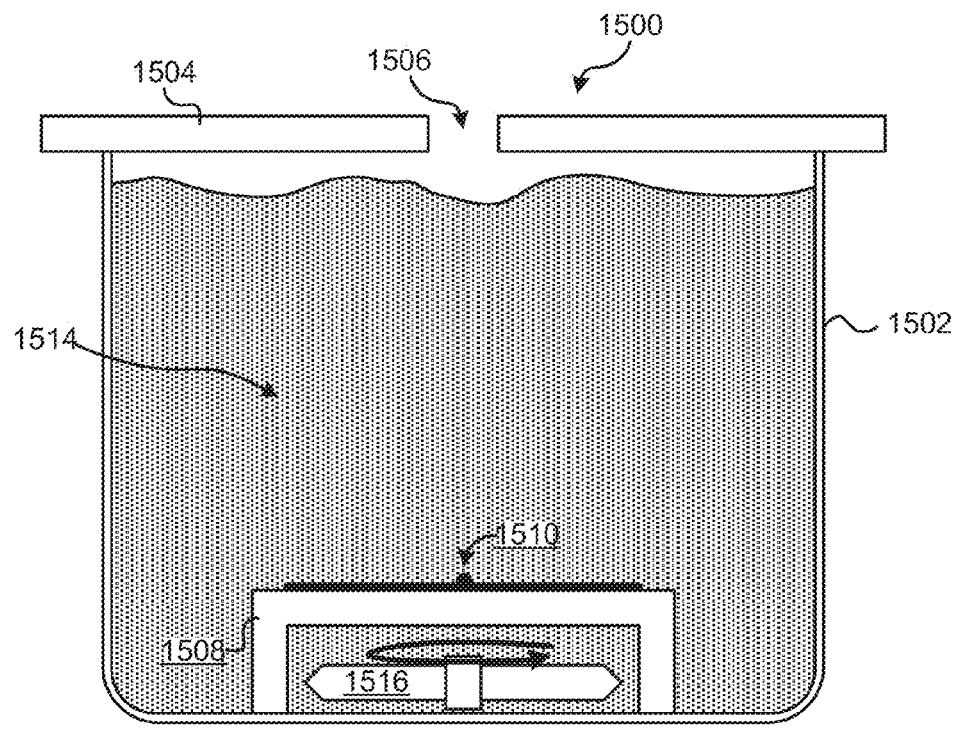
FIG. 15A shows a general schematic of a crystallizer before evaporation of a growth solution according to one embodiment.

The first experiment involved growing a single stilbene crystal in solution. All components of the raw materials used for the crystal growth in the first experiment had a purity of not lower than 98%. Crystal growth was conducted in a 2 L glass crystallizer 1500, as shown in FIG. 15. The crystallizer 1500 included a growth tank 1502, and a lid 1504 which included an evaporation hole(s) 1506. Also, the crystallizer 1500 included a platform 1508, which was positioned to accept a crystal seed 1510. In this experiment, an initial stilbene seed 1510 with dimensions of about 2.0 mm×2.0 mm×5.0 mm was mounted in the middle of a Teflon platform 1508 installed near the bottom of the crystallizer 1500. The crystallizer 1500 included a growth solution 1514, which was prepared from 226 g of the stilbene powder mixed with 1774 g of anhydrous toluene, which corresponds to the saturation point of 25° C. The solution 1514 was heated in a glass flask with a magnetic stirrer until the powder completely dissolved. The solution 1514 was then filtered and left with continuous stirring at 40° C. After two days of overheating, the solution 1514 was cooled to 30° C., transferred to the crystallizer 1500, cooled to about 25° C. (room temperature), and left for slow evaporation with continuing magnetic stirring, provided by magnetic stirrer 1516.

Figure 15B:
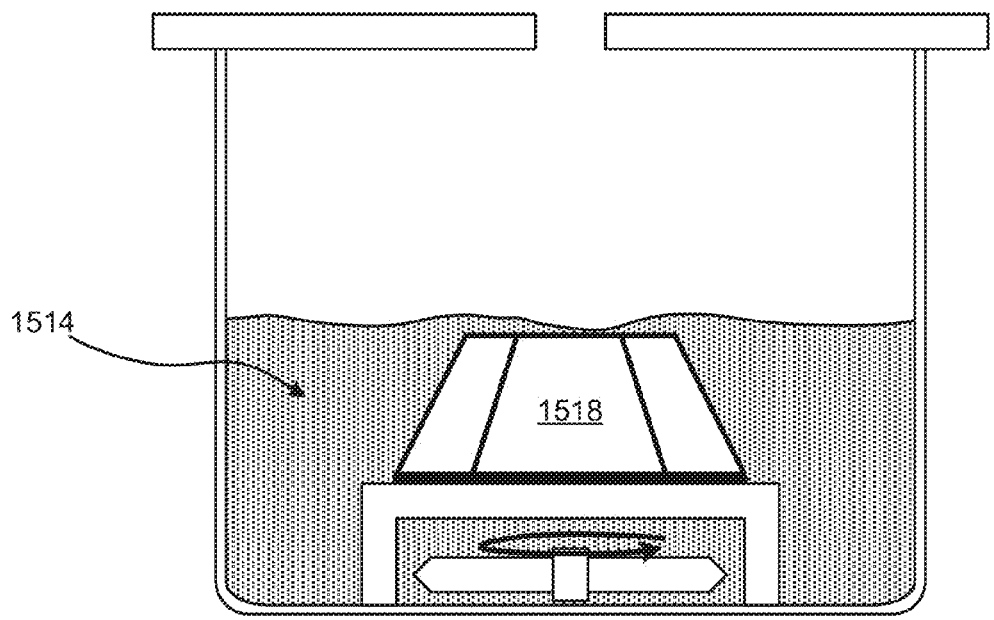
FIG. 15B shows a general schematic of a crystallizer after evaporation of a growth solution according to one embodiment.

Now referring to FIG. 15B, the crystal 1518 was removed when it grew in height close to the level of the growth solution 1514, thereby not altering the growth of the crystal 1518 by exposing one surface to a non-solution environment.

In order to grow crystals of other compounds, the initial concentration of the growth solution was changed in accordance with the solubility of the compounds measured at room temperature (about 25° C.). For example, Table I below lists crystal compounds and the corresponding masses of materials used for crystal growth in the slow evaporation experiments.

TABLE 1

Component Masses for Crystal Growth

| Crystal Compound | Mass of Powder | Mass of Solution |
| --- | --- | --- |
| 1-3-5-triphenylbenzene | 177 g of triphenylbenzene | 1823 g of toluene |
| 1-1-4-4-tetraphenyl-1-3-butadiene | 48 g of tetraphenylbutadiene | 1952 g of toluene |
| 9-10-diphenylanthracene | 68 g of diphenylanthracene | 1932 g of toluene |
| Diphenylacetylene | 1246 g of diphenylacetylene | 754 g of toluene |

Experiment 2

Solution Growth by Temperature Reduction

Figure 16:
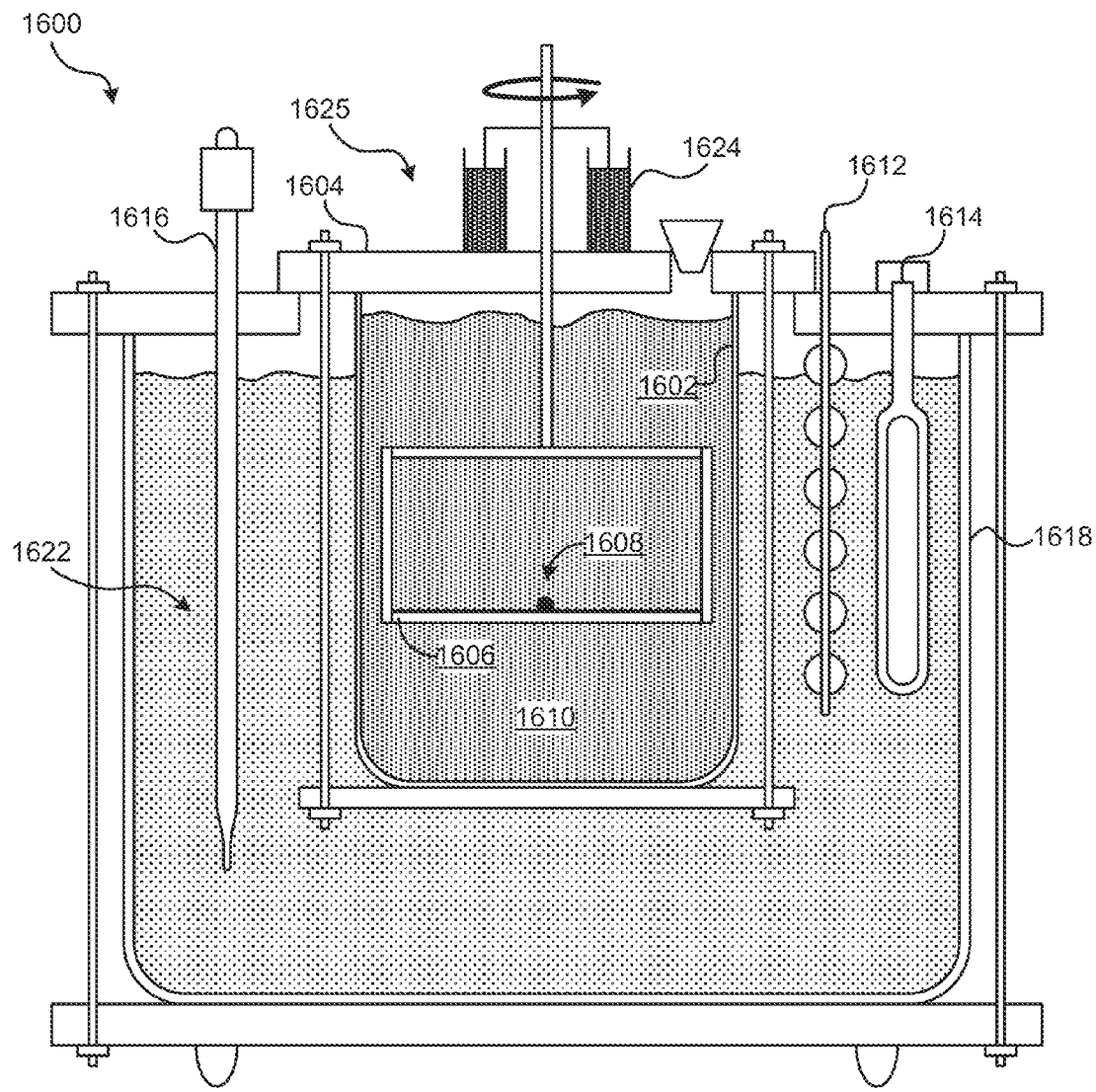
FIG. 16 shows a general schematic of a crystallizer in a water bath according to one embodiment.

The second experiment involved growing a single stilbene crystal. Crystal growth was conducted in a 1 L glass crystallizer placed in a thermo-stabilizing water bath 1600, as shown in FIG. 16. The crystallizer 1620 included a growth tank 1602, an air-sealed lid 1604, a platform 1606 for holding a crystal seed 1608, and growth solution 1610 for growth of the crystal. The apparatus 1600 also included a water bath for stabilizing the temperature of the crystallizer 1625. The water bath included a water tank 1618 at least partially filled with water 1622 or some other liquid, a stirrer 1612, a heater 1614, a thermocontroller 1616, and an air-sealed lid 1620. The platform 1606 in the crystallizer 1625 was rotatable, and the upper seal was maintained with an oil cup seal 1624.

In this case, an initial stilbene seed 1608 with dimensions of about 2.0 mm×2.0 mm×5.0 mm was mounted in the middle of a Teflon platform 1606 that was capable of being rotated at 30 RPM, with 15 second periods in a reverse direction. The growth solution 1610 was prepared from 242 g of a stilbene powder mixed with 758 g of anhydrous toluene, which corresponds to the initial saturation point of 50° C. The solution 1610 was heated in a glass flask with a magnetic stirrer until complete dissolution of the powder, then filtered and left with continuous stirring at 65° C. After two days of overheating, the solution 1610 was cooled to 57° C., transferred to the crystallizer 1625 containing the stilbene seed 1608 which was also pre-heated at 57° C. The system 1625 was left without heating until the temperature reached 50° C., when the reversible rotation was turned on. The crystal growth was conducted by the gradual decrease of the temperature to maintain a vertical growth rate of about 1 mm/day, until room temperature (about 25° C.) was reached. After that, the crystal was removed from the solution.

In order to grow crystals of other compounds, the initial concentration of the growth solution was changed in accordance with the solubility of the compounds measured at the initial saturation point of 50° C. For example, Table 2 below lists crystal compounds and the corresponding masses of materials used for crystal growth in the temperature reduction experiments.

TABLE 2

Component Masses for Crystal Growth

| Crystal Compound | Mass of Powder | Mass of Solution |
| --- | --- | --- |
| 1-3-5-Triphenylbenzene | 144 g of triphenylbenzene | 856 g of toluene |
| 1-1-4-4-tetraphenyl-1-3-butadiene | 55 g of tetraphenylbutadiene | 945 g of toluene |

Experiment 3

To determine whether organic crystals that had previously been untested for PSD properties could be used as scintillators, 60 initial sub-millimeter-size test crystals of organic compounds were evaluated for photoluminescence (PL). The PL was compared based on approximate five-level rating, with 0-level corresponding to practically non-luminescent compounds, and 5-level corresponding to the highest intensity, which was found in p-terphenyl and tetraphenylbutadiene (according to this scale, stilbene was rated as 4).

Also, all efficiently luminescent compounds were selected for further crystal growth, radio-luminescence and pulse-shape discrimination (PSD) tests. Of the initial 60 candidate materials, only 50 survived to this step of testing. These 50 candidate organic crystals were grown from solution to a size of about 0.1 mm to about 1 mm. Each crystal's luminescence properties were evaluated to down-select ten candidates with highest scintillation efficiency of not less than 0.5 of the scintillation efficiency of solid stilbene (used as a reference material).

It was surprisingly found that some solution-grown organic crystals have scintillation efficiency not only close to, but even exceeding that of stilbene. At the same time, the results of the measurements indicated that the light yield produced by the solution-grown organic crystals is substantially influenced by the impurities incorporated during the growth. This result shows that the precise comparison of the light yield in new materials can be done with extremely pure materials, which can be obtained through multiple re-crystallization procedures.

In re-crystallization, the crystals are formed, then removed from the solution. The crystals are then placed in a new volume of solvent, where they are dissolved then re-crystallized. Since a large fraction of the initial raw materials might be discarded during such procedures, the re-crystallization may increase the cost of the chemicals, as well as the time required to form individual compounds.

PSD measurements were made for neutron detection with small (about 0.5 mm to about 5 mm) organic crystals. Test measurements made with stilbene crystals showed that crystalline powder with a grain size of about 0.5 mm to about 1 mm is sufficient for preliminary (qualitative) detection of PSD.

Of course, these experiments are included as examples only, and are not meant to limit the scope of the invention in any way. The experiments conducted are reported to provide examples of how the crystal growth has been carried out in successful environments. Many other embodiments of growing crystals may be possible, and are only to be limited by the scope of the claims.

According to some embodiments of the invention, many beneficial uses may be derived. For example, some embodiments may be useful for detection of illicit nuclear weapons at ports of entry, at security checkpoints, at sensitive city installations, in scanning equipment for wide area sweeping, at off shore facilities, on ships and/or boats, etc. Some embodiments may be useful for monitoring of nuclear power plants for dangerous and/or unhealthy levels of radiation, for leakage detection, etc. Also, some embodiments may be used for the measurement of neutrons emanating from special nuclear material, possibly by further using coincidence detection (registering the nuclear multiplicity) and/or on the basis of active interrogation methods. Also, some embodiments may be used for scientific measurements of neutron emitters, such as in laboratory or classroom settings.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An organic crystal, comprising:
   an organic crystal comprising bibenzyl and stilbene or a stilbene derivative, the organic crystal having a physical property of exhibiting a signal response signature for neutrons from a radioactive source.

2. The organic crystal of claim 1, wherein the organic crystal includes one or more phenyl rings.

3. The organic crystal of claim 1, wherein the organic crystal includes a material selected from a group consisting of 1-3-5-triphenyl benzene, 1-1-4-4-tetraphenyl-1-3-butadiene, 1-4-diphenyl-1-3-butadiene, 9-10-diphenyl-anthracene, 9-phenylanthracene, diphenylacetylene, 2-fluorobiphenyl-4-carboxylic acid, 4-biphenylcarboxylic acid, and n-phenylanthranilic acid.

4. The organic crystal of claim 1, wherein the organic crystal includes a salt of an aromatic acid.

5. The organic crystal of claim 1, wherein the organic crystal includes a lithium salt of an aromatic acid.

6. The organic crystal of claim 1, wherein the organic crystal includes a lithium salt of 2-fluorobiphenyl-4-carboxylic acid.

7. The organic crystal of claim 1, wherein the organic crystal has a length of greater than about 1 mm in one dimension.

8. The organic crystal of claim 1, wherein the organic crystal has a length of greater than about 5 mm in one dimension.

9. The organic crystal of claim 1, wherein the organic crystal has a length of greater than about 25 mm in one dimension.

10. The organic crystal of claim 1, wherein the organic crystal has physical characteristics of exhibiting typical faceted growth on the faces of said crystal.

11. The organic crystal of claim 1, wherein the signal response signature includes a delayed luminescence characteristic of neutrons interacting with the organic crystal relative to a luminescence characteristic of gamma rays interacting with the organic crystal.

12. The organic crystal of claim 1, wherein the crystal has physical characteristics of formation from solution.

13. A method, comprising:
    growing the organic crystal of claim 1 from solution.

14. A system, comprising:
    the organic crystal of claim 1; and
    a photodetector for detecting the signal response of the organic crystal.

15. The system of claim 14, wherein the organic crystal has physical characteristics of exhibiting typical faceted growth on the faces of said crystal.

16. The system of claim 14, wherein the organic crystal has a length of greater than about 1 mm in one dimension.

17. The system of claim 14, wherein the signal response signature includes a delayed luminescence characteristic of neutrons interacting with the organic crystal relative to a luminescence characteristic of gamma rays interacting with the organic crystal.

18. The system of claim 14, further comprising a processor for processing an output of the photodetector using pulse shape discrimination for differentiating responses for neutrons and gamma irradiation.

19. A mixed organic crystal, comprising:
    a single mixed crystal having two compounds with different bandgap energies,
    the organic crystal having a physical property of exhibiting a signal response signature for neutrons from a radioactive source,
    wherein the signal response signature does not include a significantly-delayed luminescence characteristic of neutrons interacting with the organic crystal relative to a luminescence characteristic of gamma rays interacting with the organic crystal.

20. The organic crystal of claim 19, wherein the signal response signature is characterized by a fraction of delayed light not exceeding $10^{-3}$ of a peak intensity 30 ns after a primary luminescence signal.

21. The organic crystal of claim 19, wherein the organic crystal has physical characteristics of formation from solution.

22. The organic crystal of claim 19, wherein the organic crystal has physical characteristics of growth from melt.

23. The organic crystal of claim 19, wherein the organic crystal includes bibenzyl and stilbene or a stilbene derivative.

24. The organic crystal of claim 23, wherein a concentration of the stilbene or stilbene derivative is in a range of 10 and 99.9% (molecular %).

25. The organic crystal of claim 23, wherein a concentration of the stilbene or stilbene derivative is in a range of 0.05 and 10% (molecular %).

26. The organic crystal of claim 19, wherein the organic crystal includes diphenylacetylene (DPAC) and stilbene or a stilbene derivative.

27. The organic crystal of claim 26, wherein a concentration of the stilbene or stilbene derivative is in a range of 0.05 and 10% (molecular %).

28. The organic crystal of claim 19, wherein the organic crystal includes naphthalene and anthracene.

29. The organic crystal of claim 19, wherein the organic crystal includes biphenyl and p-terphenyl.

30. The organic crystal of claim 19, wherein the organic crystal includes p-terphenyl and p-quaterphenyl.

31. The organic crystal of claim 19, wherein the two compounds differ by a number of phenyl rings in each.

32. The organic crystal of claim 19, wherein the organic crystal includes one or more benzene or phenyl rings.

33. The organic crystal of claim 19, wherein the organic crystal includes a material selected from a group consisting of 1-3-5-triphenyl benzene, 1-1-4-4-tetraphenyl-1-3-butadiene, 1-4-diphenyl-1-3-butadiene, 9-10-diphenyl-anthracene, 9-phenylanthracene, diphenylacetylene, 2-fluorobiphenyl-4-carboxylic acid, 4-biphenylcarboxylic acid, and n-phenylanthranilic acid.

34. The organic crystal of claim 19, wherein the organic crystal includes a salt of an aromatic acid.

35. The organic crystal of claim 19, wherein the organic crystal includes a lithium salt of an aromatic acid.

36. The organic crystal of claim 19, wherein the organic crystal includes a lithium salt of 2-fluorobiphenyl-4-carboxylic acid.

37. The organic crystal of claim 19, wherein the organic crystal has a length of greater than about 1 mm in one dimension.

38. The organic crystal of claim 19, wherein the organic crystal has a length of greater than about 5 mm in one dimension.

39. The organic crystal of claim 19, wherein the organic crystal has a length of greater than about 25 mm in one dimension.

40. The organic crystal of claim 19, wherein the organic crystal has physical characteristics of exhibiting typical faceted growth on the faces of said crystal.

41. A method, comprising:
growing the organic crystal of claim 19 from solution.

42. A system, comprising:
the organic crystal of claim 19; and
a photodetector for detecting the signal response of the organic crystal.

* * * * *